(12) United States Patent
Arp et al.

(10) Patent No.: US 10,684,642 B2
(45) Date of Patent: Jun. 16, 2020

(54) ADAPTIVE CLOCK MESH WIRING

(71) Applicant: International Business Machines Corporation, Armonk, NY (US)

(72) Inventors: Andreas H. A. Arp, Nufringen (DE); Fatih Cilek, Boeblingen (DE); Michael V. Koch, Ehningen (DE); Matthias Ringe, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 15/925,987

(22) Filed: Mar. 20, 2018

(65) Prior Publication Data

US 2019/0294203 A1 Sep. 26, 2019

(51) Int. Cl.
G06F 17/50 (2006.01)
G06F 1/10 (2006.01)
G06F 1/08 (2006.01)

(52) U.S. Cl.
CPC . G06F 1/10 (2013.01); G06F 1/08 (2013.01)

(58) Field of Classification Search
CPC .................................... G06F 1/10; G06F 1/08
USPC ........................................................ 716/113
See application file for complete search history.

(56) References Cited

U.S. PATENT DOCUMENTS

| | | | | |
|---|---|---|---|---|
| 6,205,570 B1 * | 3/2001 | Yamashita | ............ | G06F 17/505 716/113 |
| 6,415,426 B1 * | 7/2002 | Chang | ................ | G06F 17/5072 716/113 |
| 6,698,006 B1 * | 2/2004 | Srinivasan | ................ | G06F 1/10 716/114 |
| 7,516,437 B1 * | 4/2009 | Kannan | ............... | G06F 17/5077 716/126 |
| 8,001,504 B1 * | 8/2011 | Campbell | ........... | G06F 30/3312 716/106 |
| 8,863,066 B1 | 10/2014 | Kozhaya et al. | | |
| 9,143,122 B1 | 9/2015 | Gaide | | |
| 2002/0120913 A1 * | 8/2002 | Suzuki | ................ | G06F 17/5077 716/113 |
| 2008/0115098 A1 * | 5/2008 | Chang | ................. | G06F 30/3312 716/103 |
| 2009/0217225 A1 * | 8/2009 | Sunder | ................ | G06F 30/3312 716/113 |

(Continued)

OTHER PUBLICATIONS

Anonymous, "A Method and System for Minimizing Wire Length of a Clock Network," IP.com Prior Art Database Technical Disclosure, IP.com No. IPCOM000204797D, Mar. 10, 2011, 2 pages.

(Continued)

Primary Examiner — Suchin Parihar
(74) Attorney, Agent, or Firm — James L. Olsen

(57) ABSTRACT

Aspects of the present disclosure relate to adaptive mesh wiring. A clock signal is provided to a clock mesh area, wherein the clock mesh area includes a plurality of wires configured in a grid. A pair of loads with impermissible skew within the clock mesh area is identified based on a threshold value. A mesh network area partition enclosing the pair of loads with impermissible skew is determined. Modifications are then made to the mesh network area partition to attempt to reduce skew. In some embodiments, a wire width of a portion of wires included in the mesh network area partition is increased. In some embodiments, a wire is added in between two wires present in the mesh network area partition.

25 Claims, 10 Drawing Sheets

(56) References Cited

U.S. PATENT DOCUMENTS

| | | | | |
|---|---|---|---|---|
| 2012/0013373 A1* | 1/2012 | Nakamura | ............ | G06F 30/394 327/141 |
| 2012/0240091 A1* | 9/2012 | Sunder | ................... | G06F 17/11 716/113 |
| 2014/0007034 A1* | 1/2014 | Hu | ....................... | G06F 30/394 716/113 |
| 2014/0337657 A1* | 11/2014 | Watanabe | ............ | G06F 30/394 713/501 |
| 2015/0095871 A1 | 4/2015 | Kitaura | | |
| 2015/0227668 A1* | 8/2015 | Liu | ...................... | G06F 30/394 716/130 |

OTHER PUBLICATIONS

Cho et al., "Clock Mesh Network Design with Through-Silicon Vias in 3D Integrated Circuits," ETRI Journal, vol. 36, No. 6, Dec. 2014, pp. 931-941.

Farshidi et al., "A Multiobjective Cooptimization of Buffer and Wire Sizes in High-Performance Clock Trees," IEEE Transactions on Circuits and Systems—II: Express Briefs, vol. 64, No. 4, Apr. 2017, pp. 412-416.

Samanta et al., "Discrete Buffer and Wire Sizing for Link-Based Non-Tree Clock Networks," IEEE Transactions on Very Large Scale Integration (VLSI) Systems, vol. 18, No. 7, Jul. 2010, pp. 1025-1035.

* cited by examiner

ADAPTIVE CLOCK MESH WIRING

BACKGROUND

The present disclosure relates generally to the field of digital circuits, and specifically to clock mesh design.

Clocks signals are used to coordinate actions of digital circuits. Specifically, clock signals oscillate between high and low states, and the rising and/or falling edges between the high and low states can be used to issue actions in a synchronized manner within a digital circuit. In order to distribute a clock signal across a multitude of loads (e.g., registers, flip-flops, memory cells, etc.) disposed on digital circuit, various circuit configurations are used. For example, clock distribution networks such as clock trees or clock meshes can be used to distribute a clock signal to a multitude of loads disposed on a digital circuit.

SUMMARY

Embodiments of the present disclosure relate to adaptive mesh wiring. A clock signal is provided to a clock mesh area, wherein the clock mesh area includes a plurality of wires configured in a grid. A pair of loads with impermissible skew within the clock mesh area can then be identified based on a threshold value. A mesh network area partition enclosing the pair of loads with impermissible skew can then be determined. Modifications can then be made to the mesh network area partition to attempt to reduce skew. In some embodiments, a wire width of a portion of wires included in the mesh network area partition is increased. In some embodiments, a wire is added in between two wires present in the mesh network area partition.

In accordance with embodiments of the present disclosure, adaptive mesh wiring can also include identifying a pair of loads with permissible skew within the clock mesh area based on a threshold value. A mesh network area partition enclosing the pair of loads with permissible skew can be determined. A wire width of a portion of wires included in the mesh network area partition can then be decreased.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
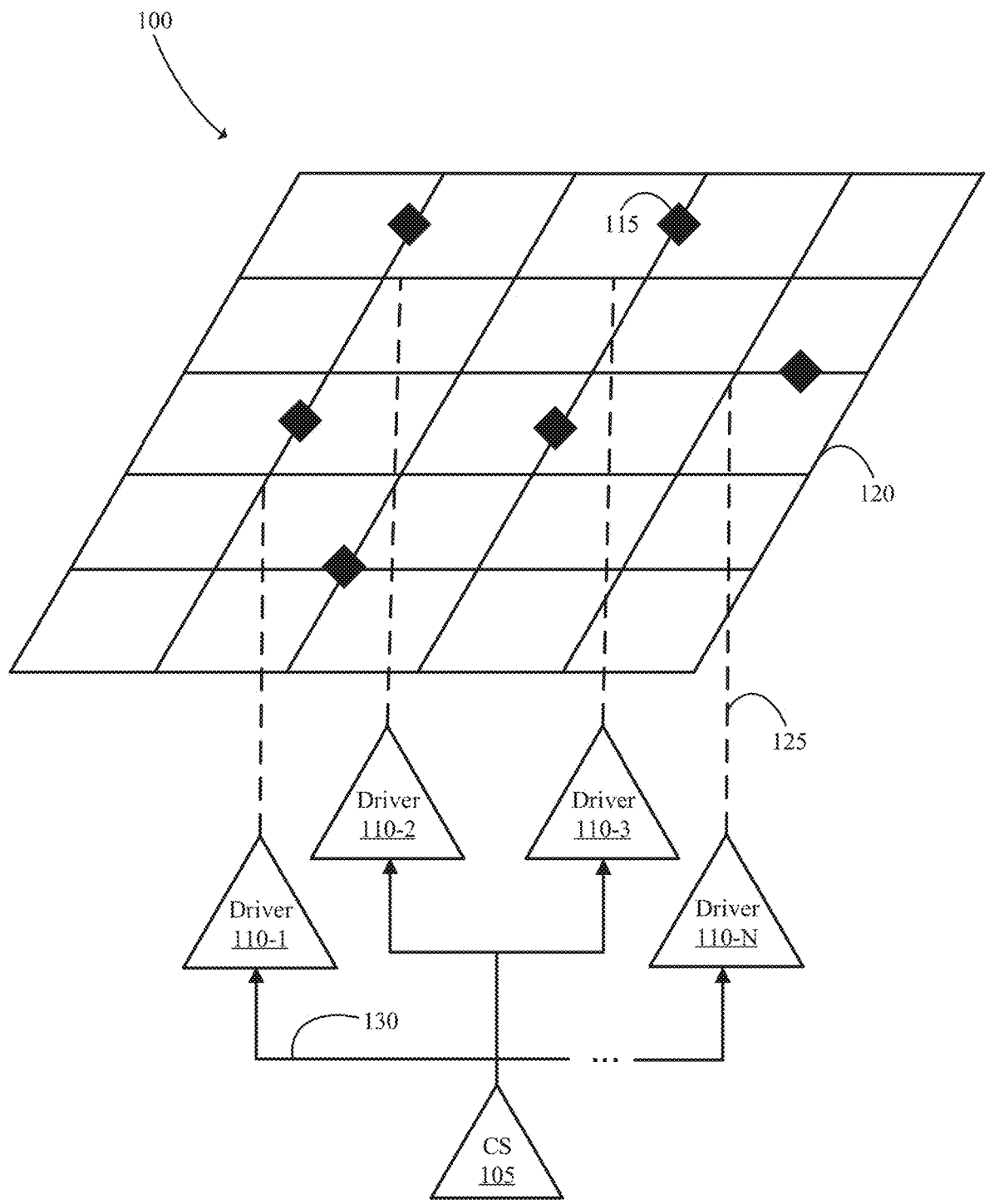
FIG. 1 is a diagrammatic depiction of a clock mesh distribution network, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the digital circuits, and in particular to clock mesh design. While the present disclosure is not necessarily limited to such applications, various aspects of the disclosure may be appreciated through a discussion of various examples using this context.

Clock distribution networks can be used to distribute clock signals to loads (e.g., sinks) configured on a circuit. Typically, clock distribution networks are configured as a tree, in which a clock source transmits a clock signal through distinct paths to loads configured within the circuit. Due to the distinct paths present in the circuit design, the clock signal can arrive at two particular loads at different times. The time difference between a clock signal reaching two loads is referred to as "clock skew". Generally, clock skew is undesirable, as it can lead to functional errors. For example, if a clock signal travels slower than a data path from one register to another, data can be written to the two registers in the same clock cycle, which could destroy the integrity of the latched data (e.g., as the previous data is not held long enough at the destination flip-flop to be clocked through (also referred to as a "hold violation")).

Clock skew occurring over long distances between distinct paths is typically referred to as a "set-up violation". This type of skew can be mitigated by integrating buffers and/or drivers between the clock source and loads. The buffers and/or drivers can process/store the signals from the clock source such that skew between distinct paths in the clock tree is reduced. Further, these types of errors can be mitigated by slowing down the frequency of the clock signal.

Another example of a clock distribution network is a clock mesh. Clock meshes include a grid of transmission lines (e.g., wires) in which the loads are disposed on. In these distribution networks, the clock source dispatches the clock signal to the mesh such that loads on the mesh are synchronized. Clock meshes are advantageous to clock trees because skew caused by the clock signal traveling through distinct paths is reduced (as the loads are disposed on a common grid). However, skew over short distances (e.g., within a 500 micron by 500 micron square area) still occurs. This type of skew is referred to as "local skew". Local skew can also cause functional errors. For example, local skew can cause new data to arrive before the clock closes the receiving latch for a previous cycle, overwriting the correct data. This is called a "hold violation", and cannot be avoided by simply slowing down the clock frequency. Accordingly, a solution to mitigating local skew in clock mesh circuits is desired.

Aspects of the present disclosure relate to reducing local skew in clock mesh distribution systems. A pair of loads within a mesh network having impermissible skew is identified. In response to identifying the pair of loads having impermissible skew, a mesh network area partition enclosing the pair of loads having impermissible skew is determined. One or more modifications are then made to the mesh network area partition to attempt to reduce local skew. In some embodiments, modification includes increasing a thickness of a portion of wires within the mesh network area partition. In some embodiments, modification includes adding a wire in between wires within the mesh network area partition.

Reducing skew in the clock mesh distribution system is beneficial, as timing errors (e.g., set-up and hold violations) can be reduced. This reduces the likelihood that data corruptions occur within the distribution network. Further, by only locally modifying the mesh network, excessive power consumption can be reduced. Because the modifications (e.g., increasing wire thickness and/or adding wires) executed to reduce skew increase the current drawn by the mesh network, power consumption increases. Accordingly, restricting modifications in non-critical areas is beneficial to reduce power consumption.

Referring now to the figures, FIG. 1 is a diagrammatic depiction of a clock mesh distribution network 100, in accordance with embodiments of the present disclosure. The clock mesh distribution network 100 includes a clock source (CS) 105, a set of drivers 110-1, 110-2 . . . 110-N (herein collectively drivers 110), and a plurality of loads 115 (individually referred to as load 115 and represented by diamonds in FIG. 1). The CS 105 generates a clock signal and transmits the signal to the drivers 110 through a clock source circuitry 130 (represented in FIG. 1 by solid arrows). Upon receiving the clock signals from the CS 105, the drivers 110 dispatch the signal to a clock mesh 120 via driver circuitry 125 (represented in FIG. 1 by dashed lines).

The loads 115 receive the clock signal from the clock mesh 120. The clock signal (as transmitted from the CS 105) coordinates the timing of actions within the clock distribution network 100. The clock signal oscillates between a high and low state. The time elapsed from the start of the high state to the end of the low state is referred to as a clock cycle. Actions can be completed on a per cycle basis. For example, data transfer can occur on a rising or falling edge of each cycle. However, in some instances, multiple instructions can be executed within a single clock cycle. For example, in the case of dual data rate (DDR) transfer, data transfer is completed at the falling and rising edge of the clock signal.

The CS 105 can be any suitable clock generator. In some embodiments, the CS 105 is a crystal oscillator that utilizes the mechanical resonance of a vibrating crystal of piezo electric material to create a clock signal with a precise frequency. In some embodiments, the CS 105 is a phase-locked loop (PLL), which generates a constant frequency output signal via a voltage-controlled oscillator. In some embodiments, the CS 105 can be a delay-locked loop (DLL), which utilizes a delay chain to generate a clock signal rather than an internal voltage-controlled oscillator.

Any suitable loads 115 can be disposed on the clock mesh 120. For example, loads can include flip-flops, registers, memory cells (e.g., SRAM or DRAM cells), and the like. The loads can store memory values (e.g., binary states), and transition to different memory states based on issued actions. The rate at which the loads 115 change memory states can be dictated by the clock cycle and/or received instructions.

The clock mesh 120 allows the clock signal to be distributed to the loads 115 with relatively low skew compared to clock tree designs. By disposing all of the loads 115 on the common clock mesh 120, the skew can be reduced compared to clock tree designs in which loads are associated with distinct branches, as there may be less variability between the paths leading to the loads 115.

The clock mesh 120 can be sized and shaped depending on a number of factors. For example, the number and placement of loads 115 can influence the size and shape of the clock mesh 120 (e.g., a large number of loads can require a larger mesh). In some embodiments, the clock mesh 120 size and shape depends on manufacturing constraints. In these embodiments, the clock mesh 120 may be sized and shaped to meet chip design constraints and/or standards. In some embodiments, the clock mesh 120 can be sized and shaped depending the rate of the CS 105. In some embodiments, the clock mesh 120 can be sized and shaped based on the number of and/or distance between the driver circuitry 125 contacts (e.g., tapping points) with the clock mesh 120.

The clock distribution network 100 can be configured such that skew is reduced. Skew reduction can be achieved in a variety of manners. For example, the drivers 110 can be fine-tuned (e.g., the time at which the signals are dispatched can be controlled via drive strength) to account for distance differences between the clock circuitry 130 and driver circuitry 125 paths. Further, the loads 115 can be positioned on the clock mesh 120 such that the time difference in which the loads 115 receive the signal is reduced. In some embodiments, the clock circuitry 130 and driver circuitry 125 can be selectively sized such that skew is reduced across the loads 115. However, the skew can be reduced in any other manner. For example, in some embodiments, clock skew can be reduced by merely altering the frequency of the clock signal originating from the CS 105.

While FIG. 1 illustrates a clock mesh distribution network 100 with a clock source 105, four drivers 110, and six loads 115, suitable computing environments for implementing embodiments of this disclosure can include any number of clock sources, drivers, and/or loads. For example, some embodiments can include 16 loads. The 16 loads can all be disposed on the clock mesh 120. In some embodiments, thousands of loads can be implemented on the clock mesh 120. However, any number of loads can be present on the clock mesh 120. Some embodiments can include additional drivers (e.g., tens or hundreds) between the loads 115 and clock source 105.

It is noted that FIG. 1 is intended to depict the representative major components of an example clock mesh distribution network 100. In some embodiments, however, individual components can have greater or lesser complexity than as represented in FIG. 1, components other than or in addition to those shown in FIG. 1 can be present, and the number, type, and configuration of such components can vary. For example, some embodiments can include additional layers between the clock source and loads. For example, the clock mesh distribution network 100 can include buffer layers (e.g., between the drivers 110 and clock mesh 120), pre-mesh driver layers (e.g., between the drivers 110 and clock mesh 120), gates (e.g., between the clock mesh 120 and loads 115), etc.

Figure 2:
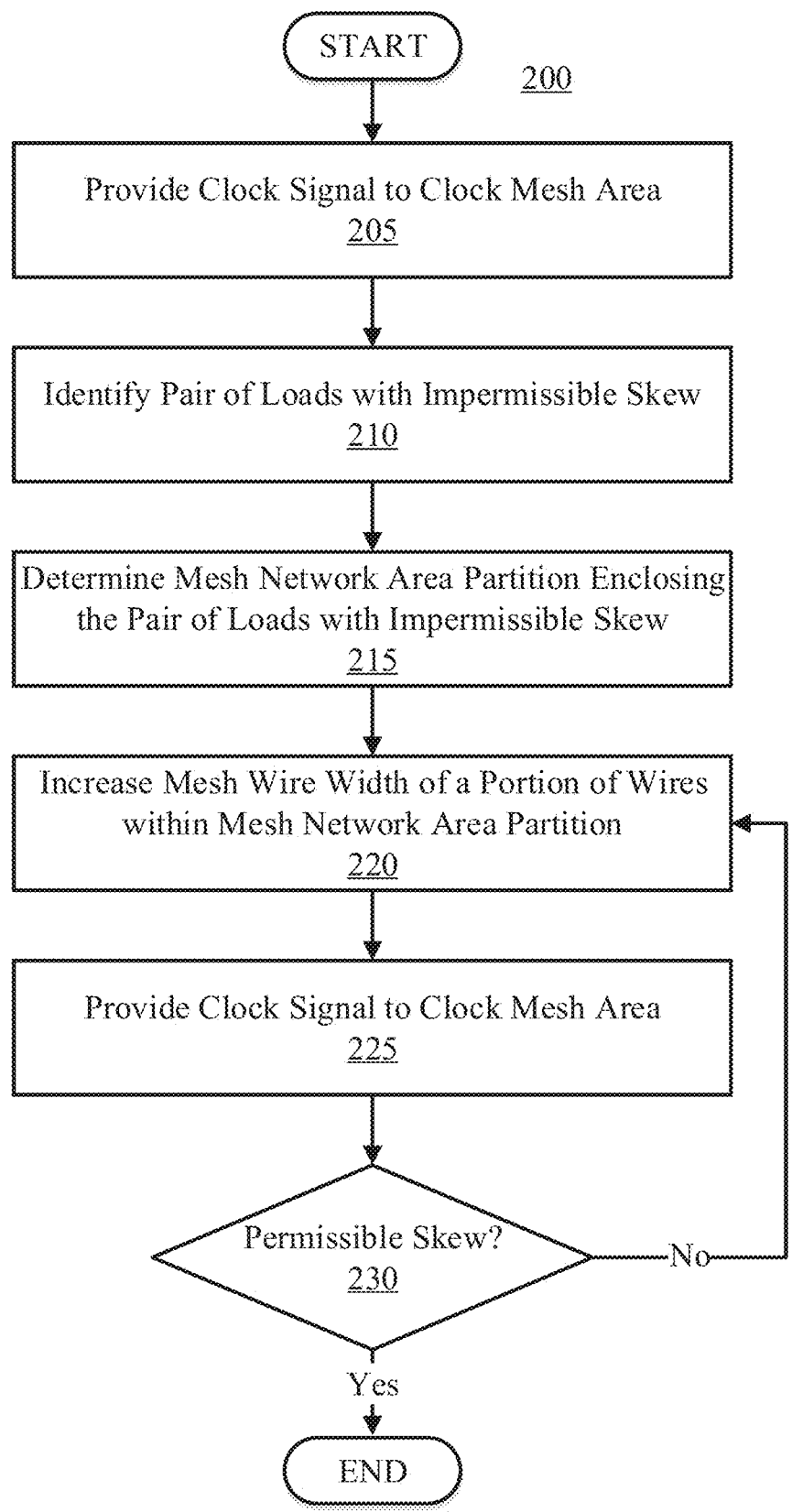
FIG. 2 is a flow diagram illustrating an example process for adaptively sizing clock mesh wiring to attempt to reduce local skew, in accordance with embodiments of the present disclosure.

FIG. 2 is a flow diagram illustrating an example process 200 for adaptively sizing clock mesh wiring to attempt to reduce local skew, in accordance with embodiments of the present disclosure. As referenced in FIG. 2, the clock mesh, drivers, loads, and clock source can be the same as or substantially similar to the clock mesh 120, drivers 110, loads 115, and clock source 105 depicted in FIG. 1.

The process 200 starts by providing a clock signal to a clock mesh area (e.g., clock mesh 120 of FIG. 1). This is illustrated at step 205. The clock signal can be provided to the clock mesh area via circuitry coupling a clock source (e.g., CS 105) to the clock mesh area. For example, as illustrated in FIG. 1, clock source circuitry 130 and driver circuitry 125 allow transmission of the clock signal from the clock source 105 to the clock mesh 120. Various intermediate components or transmission lines can be implemented to drive the clock signal to the clock mesh area. For example, drivers (e.g., drivers 110) can be implemented to drive the clock signal from the clock source to the clock mesh area.

In some embodiments, gates are implemented between the clock source and clock mesh area (or alternatively between the clock source and loads). The gates can be configured to selectively "turn on" and "turn off" portions of the digital circuitry. This can be implemented to ensure that only required portions of the clock distribution network are active to reduce power consumption.

In some embodiments, the clock signal is provided to the clock mesh area via a clock tree. For example, a hybrid clock tree/mesh design can be implemented to branch the clock signal down various paths leading to the clock mesh. This can be useful for providing the clock signal to distinct portions of the clock mesh, reducing the skew between loads configured on the clock mesh area.

In some embodiments, the clock distribution network is simulated via an analog or digital simulator (e.g., Simulation Program with Integrated Circuit Emphasis (SPICE)). The simulated circuit can then be provided with a simulated clock signal (e.g., by specifying a frequency of the signal to be transmitted to the simulated circuit).

The frequency of the clock signal provided to the clock mesh area can vary. In some embodiments, the frequency is selected based on sought design considerations (e.g., 4 GHz), to meet processing requirements, or on design constraints. In some embodiments, the frequency is tuned for skew considerations (e.g., the skew can be altered to account for long-pathing errors). In some embodiments, the frequency of the clock signal provided to the clock mesh area depends on the frequency of one or more other clocks associated with the digital circuit the clock mesh is disposed on.

A pair of loads with impermissible skew is then identified after the clock signal is provided to the clock mesh area. This is illustrated at step 210. The pair of loads with impermissible skew (e.g., high skew) can be identified in any manner. In some embodiments, the pair of loads with impermissible skew are identified based on observed errors between the loads. For example, a high relative occurrence of hold-violations (e.g., an input signal changes too soon after the clock's active transition) and/or set-up violations (e.g., when a signal arrives too late, and misses the time when it should be dispatched) can indicate whether the pair of loads have impermissible skew. In these examples, a threshold number of observable errors can be predefined in order to determine whether skew between any two loads is impermissible. For example, if a number of violations (e.g., functional errors) exceeds two violations, a determination can be made that the pair of loads have impermissible skew.

In some embodiments, the pair of loads with impermissible skew is identified based on measured skew. For example, circuitry (e.g., skew sensors and/or skitters) exists which is capable of measuring the skew between any two given points on a clock mesh. Accordingly, the skew can be measured between a pair of loads, and based on the measured skew value, a determination can be made whether the skew is high. In some embodiments, high skew is determined based on the measured skew exceeding a skew threshold. For example, if a skew threshold is set to 5 picoseconds (ps), and measured skew between two loads is 10 ps, then the skew between the pair of loads can be determined to be impermissible.

In some embodiments, the pair of loads with impermissible skew is identified based on a simulation. For example, for a simulated circuit, an analog simulation can be executed in order to determine the skew between the loads configured on the simulated circuit. In this example, the analog simulation can output a time-voltage waveform for each load, and the skew can be determined by comparing the time-voltage waveforms for each load (e.g., see FIG. 4 for more details). The skew can be indicated based on the time difference between the two wave forms (e.g., one for each load) at half of the supply voltage.

Upon identifying the pair of loads with impermissible skew, a mesh network area partition which encompasses the pair of loads with impermissible skew is determined. This is illustrated at step 215. The mesh network area partition can be an area of the clock mesh that encloses the pair of loads with impermissible skew. In some embodiments, the mesh network area partition can be the entire clock mesh network area (e.g., if the loads are on opposite corners of the clock mesh network). The clock mesh network area partition can be mapped (e.g., constructed, determined, visually represented, etc.) such that the two loads are opposite vertices (corners) of a rectangular area that includes all of the wires between the two loads (e.g., see FIG. 3B for more detail, the mesh network area partition is the gray box). In some embodiments however, if the pair of loads with impermissible skew are connected by a single wire (e.g., horizontally or vertically aligned on the mesh), the mesh network area partition can be a line between the pair of loads.

A wire width (thickness or diameter) of a portion of the wires within the mesh network area partition is increased. This is illustrated at step 220. The portion of wires that is increased can be the segment of wires electrically bridging the two loads on the clock mesh network (e.g., see FIG. 3C and FIG. 3D, only the portion of wire directly connecting the loads is resized). For example, segments of wires which do not directly electrically couple a signal from a particular load to another particular load may remain unmodified.

Conversely, in some embodiments, the thickness of all of the wires within the mesh network area partition is increased. As an example, if the pair of loads with impermissible skew are connected by a single wire (e.g., the loads are vertically or horizontally aligned on the mesh), the thickness of the entire wire in between the pair of loads can be increased. This is because the mesh network area partition and the portion of wires that bridge the pair of loads are the same.

Wire width can be locally increased to reduce skew because, by increasing the wire thickness, resistance is reduced. This allows a greater amount of current to flow between the loads and reduces the amount of time for the signal to travel between the loads (which may directly reduce skew). As an illustrative scenario, assuming there is skew between two points on a clock mesh (in which the two points are shorted within the clock mesh), a voltage difference exists between the two points. Though resistance within the mesh is relatively low (but greater than 0), high skew between the loads may indicate that the resistance is not low enough to permit a required amount of current through the loads to reduce the skew below a predefined skew threshold. By increasing the wire thickness, the resistance is reduced, which in turn allows quicker balancing of the charges (and therefore voltages). This can directly reduce the skew between any two points on the clock mesh and can be used to fine-tune local skew such that skew thresholds are satisfied.

The width of the portion of the wire can be increased in any manner. In some embodiments, the wire width is increased by a certain factor (e.g., by a factor of 2, 5, etc.) or by a certain amount (e.g., increase the wire diameter by 0.2 µm, 0.5 µm, etc.). In some embodiments, the wire width is increased to a fixed value. For example, the wire width can be increased to a specified diameter (e.g., 2 µm diameter). In some embodiments, the wire width is increased based on available wire sizes (e.g., if only 1 µm, 1.4 µm, and 1.8 µm diameter wires are available, the width can be selected based on the available wires). In some embodiments, the wire width is increased based on the measured skew. For example, wires coupling pairs of loads with relatively higher skew can have their thickness increased by a greater amount (e.g., wires between loads with a 6 ps skew measurement may only have their diameter increased by 0.3 µm, whereas wires between loads with a 20 ps skew measurement may have their diameter increased by 1 µm).

In some embodiments, wire thickness is increased in a simulated circuit. In these embodiments, simulated wires can be modified as specified by simulation software. For example, wire thickness can be increased in a simulation by setting the wire diameter to a specific value. The simulated circuit with the modified wires can then be transmitted to be used for manufacturing (e.g., the simulated circuit is used a blue-print for photolithography manufacturing).

In some embodiments, wire thickness is incrementally increased until a proper wire thickness is selected. For example, the wire thickness can be increased by a certain amount (e.g., 0.05 µm) every iteration until a determination is made that the skew is permissible (further discussed with regard to decision block 230).

In some embodiments, wire thickness is increased on a physical circuit. In some embodiments, wire thickness is increased using photolithography techniques. In some embodiments, wire thickness is increased by replacing wires with thicker wires (e.g., using a precision placement assembly). In some embodiments, wire thickness is increased by depositing additional conductive material on wires (e.g., using soldering techniques or 3-D printers). The thickness of physical wires can be increased in any manner otherwise consistent herein.

Locally increasing wire width is beneficial as compared to increasing wire width of an entire mesh (or large portions of the mesh), as power consumption is reduced. Because increasing the wire thickness reduces resistance in the wires, more power is consumed by the mesh in the local areas. If this is completed on a larger scale (e.g., the entire mesh), power consumption can exceed permissible power thresholds. Accordingly, maintaining narrow wires in non-critical areas (e.g., areas which do not have loads exceeding skew thresholds) is beneficial for decreasing power consumption.

After the wire width of the portion of wires within the mesh network area partition is increased, a clock signal is provided to the clock mesh area again. This is illustrated at step 225. The clock signal provided at step 225 can be the same as the clock signal provided at step 205 (e.g., with the same frequency from the same clock source). In some embodiments, however, the clock signal provided at step 225 can differ from the clock signal provided at step 205 (e.g., the new signal can originate from a different clock source, or alternatively have different characteristics (such as frequency)). This is completed to determine whether the skew is permissible between the identified loads with impermissible skew.

After the wire thickness for the portion of wires is increased and the clock signal is provided again, a determination is made whether the skew for the pair of loads is permissible. This is illustrated at step 230. Step 230 can be completed in a similar manner to step 210 for identifying the pair of loads with impermissible skew. However, at step 230, the same pair of loads identified with impermissible skew is analyzed to determine whether the skew is permissible. For example, observed functional errors or measured skew can be used to determine whether the skew is permissible. If observed functional errors are used to determine whether skew is permissible, the observed functional errors can be compared to a functional error threshold. If the functional error threshold is satisfied (e.g., the number of observed functional errors is equal to or less than the specified threshold), a determination can be made that the skew is permissible. Similarly, if measured skew is used to determine whether the skew is permissible, the measured skew can be compared to a skew threshold. If the skew threshold is satisfied (e.g., the measured skew is equal to or less than the skew threshold), a determination can be made that the skew is permissible.

If a determination is made that the skew is permissible at step 230, then process 200 ends, as increasing the wire thickness in the local area was effective (as the skew was brought down to a permissible level). If a determination is made that the skew is impermissible, then step 230 moves back to step 220, where the portion of wires within the mesh network area partition is increased. This can be completed to incrementally increase the wire thickness until a satisfactory skew between the two loads is attained. For example, the wire thickness can be increased at step 220 by 0.1 m, and a clock signal can then be provided to the modified mesh. A determination can then be made whether the skew is permissible at step 230. If the skew is not permissible, then process 200 may move back to step 220 again, where the wire thickness is increased by another 0.1 µm. This can be repeated until the skew is at a permissible level. The wire thickness can be increased by any increment (e.g., 0.01 µm, 0.1 µm, 1 µm, etc.). Smaller increments can be implemented to identify the minimum (or near minimum) wire thickness increase to attain the permissible skew level.

In some embodiments, a wire thickness threshold is implemented to terminate process 200. If, after a number of iterations, the wire thickness exceeds a predetermined wire thickness threshold (e.g., a wire thickness upper limit), process 200 can automatically end. For example, if an upper limit wire thickness threshold is a 2 μm diameter, process 200 ends if the upper limit wire thickness is exceeded prior to attaining permissible skew (e.g., if a 1.5 μm wire is increased by iterations of 0.1 μm at step 220 and a permissible skew is not attained at step 230 after 5 iterations, then process 200 automatically ends, as the upper limit wire thickness is exceeded prior to attaining permissible skew).

Figure 8:
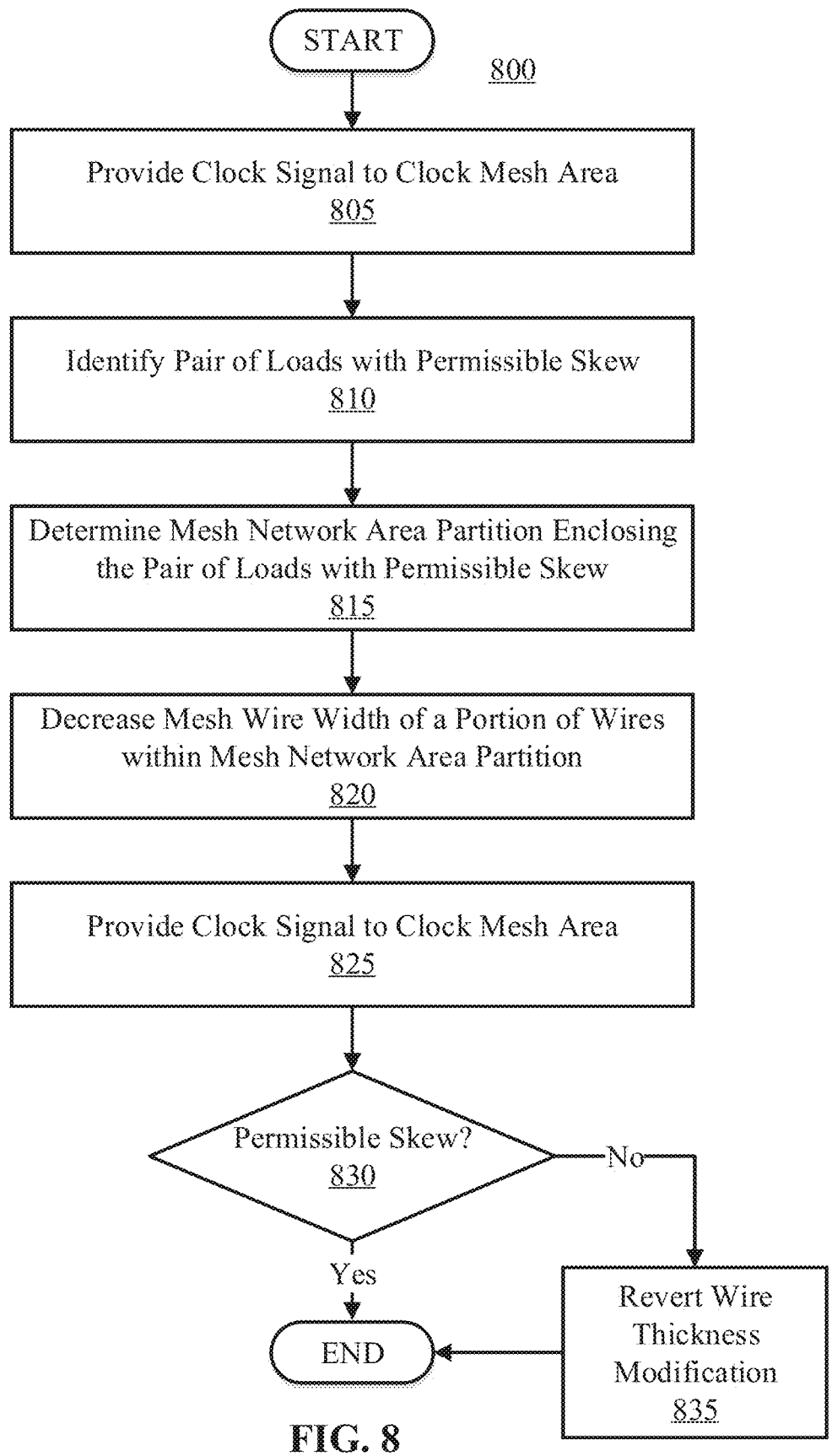
FIG. 8 is a flow diagram illustrating a process for attempting to reduce local power consumption in a clock mesh by decreasing wire thickness, in accordance with embodiments of the present disclosure.

In some embodiments, in response to a determination that the skew is permissible at step 230 (or generally any determination that the skew is permissible, see FIG. 8 for more detail), the wire thickness of one or more wires (or a portion thereof) included in the mesh network area partition is decreased. This can be completed to reduce the power consumption in the circuit. For example, if a skew threshold is set to 5 ps, and a measured skew is 1 ps, a determination can be made that the skew is permissible. In response to determining that the skew is permissible, an action can be executed to decrease the wire thickness such that power consumption is reduced. In these embodiments, local skew may increase as a result of decreasing the wire thickness, however, if the skew increases but remains permissible, power consumption can be reduced while satisfying (e.g., falling below) the skew threshold(s). After decreasing the wire thickness, a determination can be made whether the skew remains permissible. If the skew remains permissible, then decreasing the wire thickness may have successfully reduced power consumption while maintaining a permissible skew level.

FIGS. 3A, 3B, 3C, and 3D illustrate diagrammatic depictions for the process 200 to attempt to reduce local skew in a clock mesh by increasing wire thickness, in accordance with embodiments of the present disclosure.

Figure 3A:
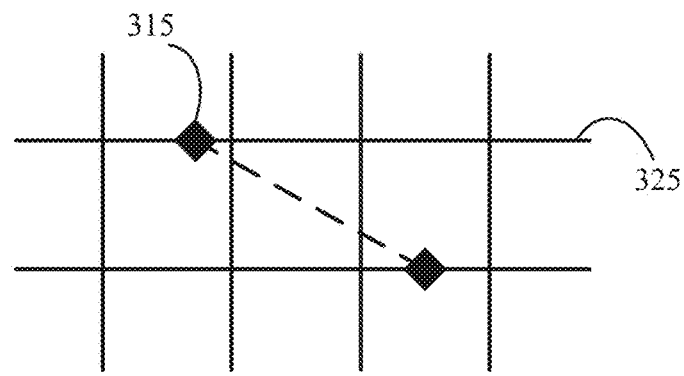
FIGS. 3A, 3B, 3C, and 3D illustrate diagrammatic depictions for a process to attempt to reduce local skew in a clock mesh by increasing wire thickness, in accordance with embodiments of the present disclosure.

As depicted in FIG. 3A, a pair of loads 315 (as indicated by the diamonds connected by a dashed line) with impermissible skew on a clock mesh area 325 is identified. The pair of loads 315 with impermissible skew can be identified in a similar manner to step 210 of FIG. 2. For example, observed functional errors and measured skew can be used to determine whether the skew is impermissible by comparing the observed metrics to one or more thresholds.

Figure 3B:
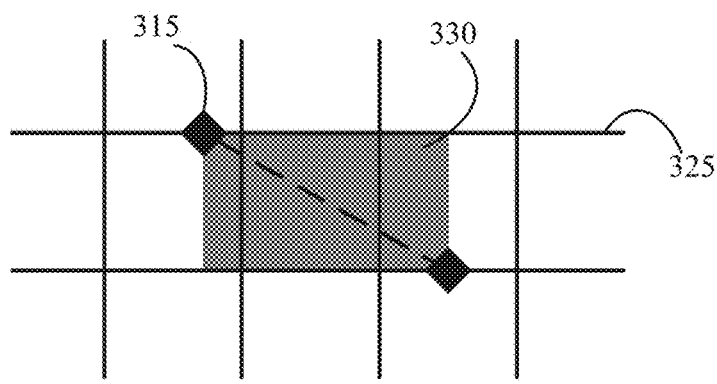

In FIG. 3B, a mesh network area partition 330 encompassing (e.g., enclosing) the pair of loads 315 on the clock mesh area 325 is determined. The mesh network area partition 330 can be a rectangular or square area that encompasses the pair of loads 315. In some embodiments, the loads are vertices on opposite diagonal corners of the mapped area. This ensure that all of the wires in between the pair of loads 315 are identified. In some embodiments, however, if the pair of loads 315 are connected by a single wire (e.g., vertically or horizontally aligned), the mesh network area partition is a single line between the pair of loads 315.

Figure 3C:
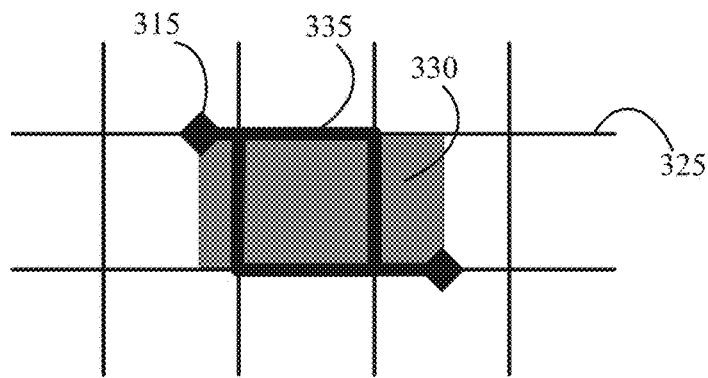

Referring now to FIG. 3C, a wire diameter of a portion of wires 335 within the mesh network area partition 330 is increased. The wire diameter of the portion of wires 335 can be increased in a similar manner as step 220 of FIG. 2. For example, the wire diameter can be increased by a particular magnitude, value, etc. In some embodiments, the wire diameter can be increased based on observed skew (e.g., greater skew may lead to a greater wire thickness increase). The wire diameter can be increased such that resistance within the portion of wires 335 is reduced, increasing the current in the portion of wires 335 and potentially reducing skew between the pair of loads 315.

Figure 3D:
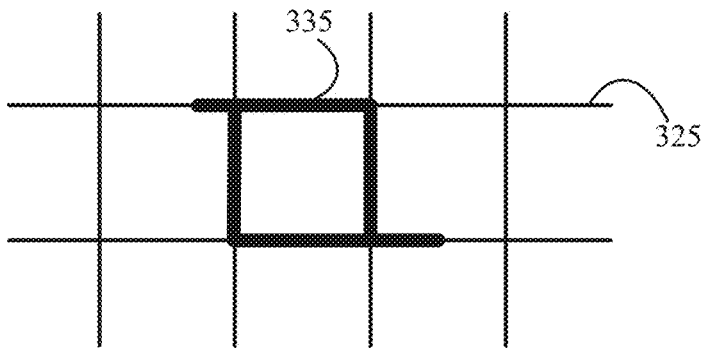

Referring now to FIG. 3D, illustrated is a diagram of the clock mesh 325 with the portion of wires 335 with increased thickness, omitting the pair of loads 315 and the mesh net area partition 330 from the view, in accordance with embodiments of the present disclosure. The diameter is not increased for the portion of wires which do not electrically couple the pair of loads 315 within the mesh network area partition 330 (e.g., the portion of wires within the mesh net area partition 330 that are not represented with thicker lines).

Figure 4:
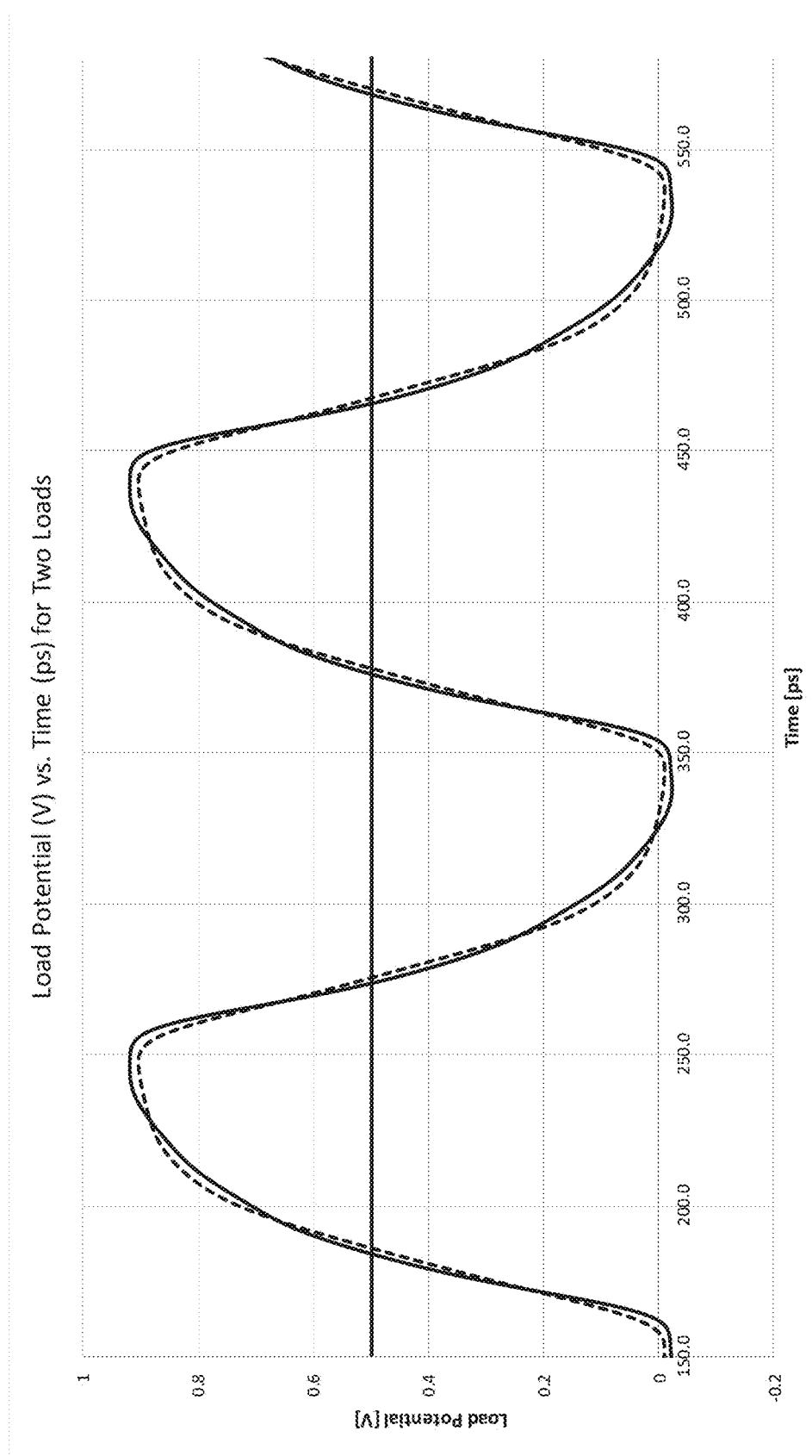
FIG. 4 is a graph illustrating two load potential vs. time curves for two respective loads configured on a circuit, in accordance with embodiments of the present disclosure.

Referring now to FIG. 4, shown is a graph of two load potential vs. time curves (time-voltage curves) for two respective loads configured on a circuit, in accordance with embodiments of the present disclosure. This graph illustrates an example strategy to determine skew between a pair of loads. The determined skew can be used to indicate whether skew between two loads is permissible. In some embodiments, the curves are obtained via an analog simulation of simulated circuit components in a software program (e.g., SPICE).

As depicted in FIG. 4, one load-potential vs. time curve is depicted with a dashed line and the other load-potential vs. time curve is depicted with a solid line. Skew is indicated as the time difference of the two load potential vs. time curves at half of the supply voltage. In this instance, half of the supply voltage is 0.5V, so the skew can be determined by taking the absolute value of the time difference between the two loads at y=0.5V. Because each curve crosses 0.5V five times in FIG. 4, five skew measurements can be obtained. These skew measurements are: (|184.7 ps–186.9 ps|=2.2 ps), (|273.1 ps–275.5 ps|=2.4 ps), (|376.7 ps–378.9 ps|=2.2 ps), (|465.1 ps–467.5 ps|=2.4 ps), (|568.7 ps–570.9 ps|=2.2 ps).

The obtained skew value(s) can then be used to determine whether the skew is permissible. In some embodiments, the measured skew values can be averaged prior to making a determination on whether the skew is permissible. As an example, an average skew value can be calculated for the five measured skew values (2.28 ps). After the average skew value is calculated, it can be compared to one or more skew thresholds to determine whether skew is permissible. If a skew threshold upper-limit is set to 5 ps, the average skew value of 2.28 ps satisfies the skew threshold, and accordingly a determination is made that the skew is permissible. However, in some embodiments, each measured skew value can be individually analyzed to determine whether skew is permissible. For example, if an upper limit skew threshold is 2.3 ps, only the 2.2 ps measurements would satisfy the skew threshold (and be determined to be permissible), whereas the 2.4 ps measurements would exceed the skew threshold (and thus be determined to be impermissible).

Figure 5:
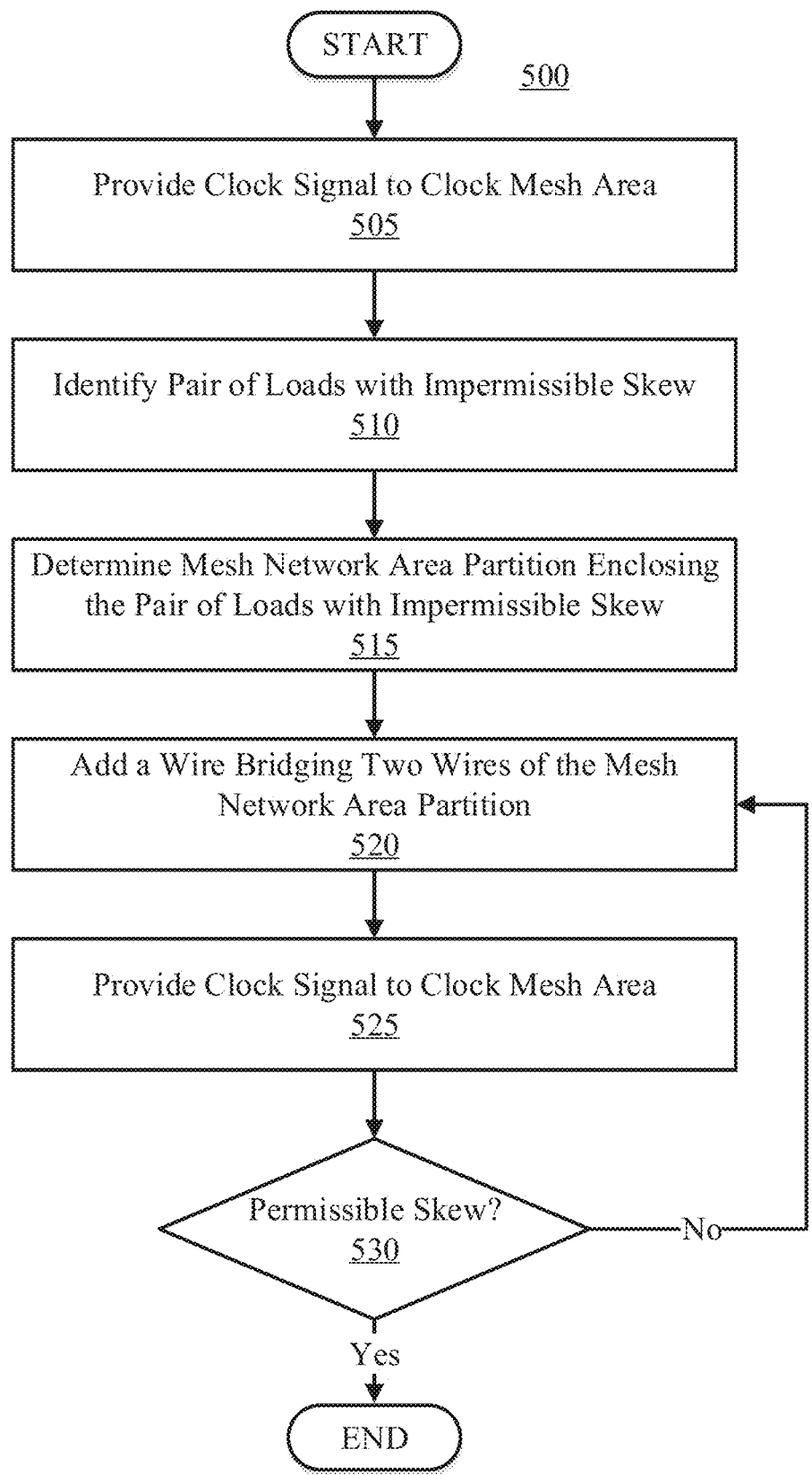
FIG. 5 is a flow diagram illustrating a process for attempting to reduce local skew in a clock mesh by adding one or more wires, in accordance with embodiments of the present disclosure

Referring now to FIG. 5, shown is a flow diagram illustrating a process 500 for attempting to reduce local skew in a clock mesh by adding one or more wires, in accordance with embodiments of the present disclosure. As referenced in FIG. 5, the clock mesh, drivers, loads, and clock source can be the same as or substantially similar to the clock mesh 120, drivers 110, loads 115, and clock source 105 depicted in FIG. 1.

The process 500 starts by providing a clock signal to a clock mesh area (e.g., clock mesh 120 of FIG. 1). This is illustrated at step 505. The clock signal can be provided to the clock mesh area via circuitry coupling a clock source (e.g., CS 105) to the clock mesh area. For example, as illustrated in FIG. 1, clock source circuitry 130 and driver circuitry 125 allow transmission of the clock signal from the clock source 105 to the clock mesh 120. Any intermediate components or transmission lines can be implemented to drive the clock signal to the clock mesh area.

In some embodiments, the clock signal is provided to the clock mesh area via a clock tree. For example, a hybrid clock tree/mesh design can be implemented to branch the clock signal down various paths leading to the clock mesh. This can be useful for providing the clock signal to distinct portions of the clock mesh, reducing the skew between loads configured on the clock mesh area.

In some embodiments, the clock distribution network can be simulated via an analog or digital simulator (e.g., SPICE). The simulated circuit can then be provided with a simulated clock signal (e.g., by specifying a frequency of the signal to be transmitted to the simulated circuit).

The frequency of the clock signal provided to the clock mesh area can vary. In some embodiments, the frequency is selected based on sought design considerations (e.g., 4 GHz), to meet processing requirements, or on design constraints. In some embodiments, the frequency is tuned for skew considerations (e.g., the skew can be altered to account for long-pathing errors). In some embodiments, the frequency of the clock signal provided to the clock mesh area depends on the frequency of one or more other clocks associated with the digital circuit the clock mesh is disposed on.

A pair of loads with impermissible skew is then identified after the clock signal is provided to the clock mesh area. This is illustrated at step 510. The pair of loads with impermissible skew (e.g., high skew) can be identified in any manner. In some embodiments, the pair of loads with impermissible skew are identified based on observed errors between the loads. For example, a high relative occurrence of hold-violations and/or set-up violations can indicate whether the pair of loads have impermissible skew. In these examples, a threshold number of observable errors can be predefined in order to determine whether skew between any two loads is impermissible. For example, if a number of violations (e.g., functional errors) exceeds three violations, a determination can be made that the pair of loads have impermissible skew.

In some embodiments, the pair of loads with impermissible skew can be identified based on measured skew. For example, circuitry (e.g., skew sensors and/or skitters) exists which is capable of measuring the skew between any two given points on a clock mesh. Accordingly, the skew can be measured between a pair of loads, and based on the measured skew value, a determination can be made whether the skew is high. In some embodiments, high skew is determined based on the measured skew exceeding a skew threshold. For example, if a skew threshold is set to 3 ps, and measured skew between two loads is 5 ps, then the skew between the pair of loads can be determined to be impermissible.

In some embodiments, the pair of loads with impermissible skew can be identified based on a simulation. For example, for a simulated circuit, an analog simulation can be executed in order to determine the skew between the loads configured on the simulated circuit. In this example, the analog simulation can output a time-voltage waveform for each load, and the skew can be determined by comparing the time-voltage waveforms for each load (e.g., see FIG. 4). The skew can be indicated based on the time difference between the two wave forms (e.g., corresponding to each load) at half of the supply voltage.

Upon identifying the pair of loads with impermissible skew, a mesh network area partition which encompasses the pair of loads with impermissible skew is determined. This is illustrated at step 515. The mesh network area partition can be an area of the clock mesh that encloses the pair of loads with impermissible skew. The clock mesh network area partition can be constructed such that the two loads are opposite vertices (corners) of a rectangular area that includes all of the wires between the two loads (e.g., see FIG. 6B for more detail, the mesh network area partition is the gray box). In some embodiments, if the loads are connected by a single wire (e.g., horizontally or vertically aligned), the mesh network area can be a line connecting the pair of loads with impermissible skew.

A wire is added between two wires of the mesh network area partition. This is illustrated at step 520. The wire can be added between two wires within the mesh network area partition such that an additional interconnect exists between the pair of loads identified with impermissible skew. This can allow additional current flow between the pair of loads, and may reduce the skew between the loads such that the skew is permissible (e.g., within skew threshold constraints).

The placement of the added wire can be selected based on a range of factors. For example, the placement of the added wire may depend on manufacturing and/or design constraints and/or considerations. There may only be certain locations in which wires can be disposed (e.g., physical constraints on wire placement during manufacturing). For example, if wires can only be disposed every 10 μm (e.g., vertically and horizontally) on the mesh, then wire placement can be limited based on the manufacturing constraints. Further, wire placement may be selected in order to satisfy design constraints (e.g., predetermined constraints that are defined to optimize the mesh structure). For example, if design constraints specify that two wires cannot be disposed parallel to each other within "15 μm", then the placement of the added wire can be limited based on the design constraints.

Within manufacturing and design constraints, the placement of the wires can be selected based on available locations to place (e.g., dispose) the wires. For example, the added wire can be disposed halfway in between two wires within the grid. In some embodiments, the position of the added wire can be selected randomly while adhering to manufacturing/design constraints. However, the initial placement of the added wire can be determined in any other manner otherwise consistent herein. In some embodiments, the position of the added wire can be based on simulation data (e.g., a simulation program indicates a possible best location for the added wire out of a number of possible positions for skew reduction).

In some embodiments, the wire is physically added to a clock mesh. For example, photolithography techniques can be used to add wires to the clock mesh structure. In some embodiments, the wire can be placed via precision placement technology and mounted to the clock mesh using soldering techniques. In some embodiments, the wire can be additively manufactured (3-D printed) directly onto the clock mesh. In some embodiments, computer systems can orchestrate the placement and/or addition of wires on the clock mesh.

In some embodiments, the wire can be added to the clock mesh in a simulation. For example, for a simulated clock mesh, a simulated wire can be added to the mesh in between wires within the mesh. The simulated design can then be used during the manufacturing process. For example, the manufacturing design can be executed using photolithography techniques, or other chip manufacturing techniques readily apparent to persons of ordinary skill.

Adding wires in between wires within the clock mesh can increase power consumption, as additional current is drawn.

Accordingly, only adding wires in areas of the clock mesh which are associated with loads having high skew can be beneficial, as power consumption can be reduced as compared to adding additional wires throughout the entire mesh.

In some embodiments, wires are added incrementally until a permissible skew value is attained between the two identified loads. For example, a first wire can be added between two wires within the clock mesh, and a determination can be made whether the skew is permissible. If the skew is impermissible after the first wire addition, a second wire can be added to the clock mesh (e.g., as discussed in greater detail with regard to steps 525 and 530). Wires can be incrementally added into the wire until the skew is reduced to a permissible value.

After the wire is added between two wires within the clock mesh area partition, a clock signal is provided to the clock mesh area again. This is illustrated at step 525. The clock signal provided at step 525 can be the same as the clock signal provided at step 505 (e.g., with the same frequency from the same clock source). In some embodiments, however, the clock signal provided at step 525 can differ from the clock signal provided at step 505 (e.g., the new signal can originate from a different clock source, or alternatively have different characteristics (such as frequency)). This is completed in order to determine whether the skew is permissible between the identified loads with impermissible skew.

After the wire is added and the clock signal is provided to the clock mesh again, a determination is made whether the skew for the pair of loads is permissible. This is illustrated at step 530. Step 530 can be completed in a similar manner to steps 210 and 510 of FIGS. 2 and 5 respectively. However, at step 530, the same pair of loads identified with impermissible skew is analyzed to determine whether the skew is permissible. For example, observed functional errors or measured skew can be used to determine whether the skew is permissible. If observed functional errors are used in order to determine whether skew is permissible, the observed functional errors can be compared to a functional error threshold. If the functional error threshold is satisfied (e.g., the number of observed functional errors is less than the specified threshold), a determination can be made that the skew is permissible. Similarly, if measured skew is used in order to determine whether the skew is permissible, the measured skew can be compared to a skew threshold. If the skew threshold is satisfied (e.g., the measured skew is less than the skew threshold), a determination can be made that the skew is permissible.

If a determination is made that the skew is permissible at step 530, then process 500 ends, as adding the wire between two wires within the mesh network area partition was effective (as the skew was brought down to a permissible level). If a determination is made that the skew is impermissible, then step 530 moves back to step 520, where an additional wire is added between two wires within the wire mesh. In some embodiments, adding an additional wire can include adding the additional wire between one or more previously added wires at step 520. In some embodiments, wires are continually added in iterations until the skew level is permissible. In these embodiments, wires can be added until design/manufacturing constraints are reached.

In some embodiments, wires are iteratively added until a threshold number of additional wires are reached if the skew does not attain a permissible value. For example, if a threshold number of additional wires is set to five wires, after five wires are added to the clock mesh, process 500 can automatically terminate. In some embodiments, upon terminating process 500 due to a threshold number of wires being exceeded, process 500 can restart, and the order and/or placement of wires can vary in the next execution of process 500.

FIGS. 6A, 6B, 6C, and 6D illustrate diagrammatic depictions for the process 500 to attempt to reduce local skew in a clock mesh by adding one or more wires, in accordance with embodiments of the present disclosure.

Figure 6A:
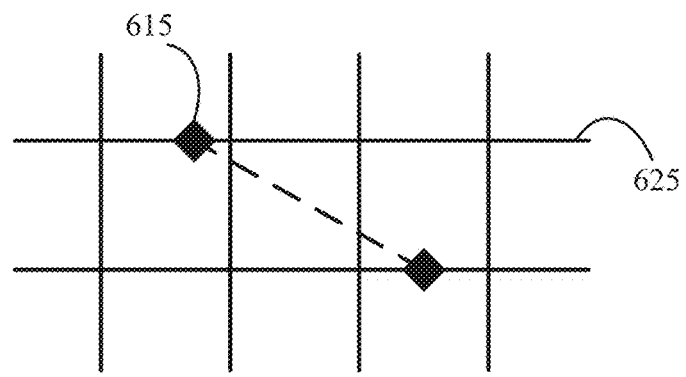
FIGS. 6A, 6B, 6C, and 6D illustrate diagrammatic depictions for a process to attempt to reduce local skew in a clock mesh by adding one or more wires, in accordance with embodiments of the present disclosure.

As depicted in FIG. 6A, a pair of loads 615 (as indicated by the diamonds connected by a dashed line) with impermissible skew on a clock mesh area 625 is identified. The pair of loads 615 with impermissible skew can be identified in a similar manner to step 510 of FIG. 5 (or step 210 of FIG. 2). For example, observed functional errors and measured skew can be used to determine whether the skew is impermissible by comparing the observed metrics to one or more thresholds.

Figure 6B:
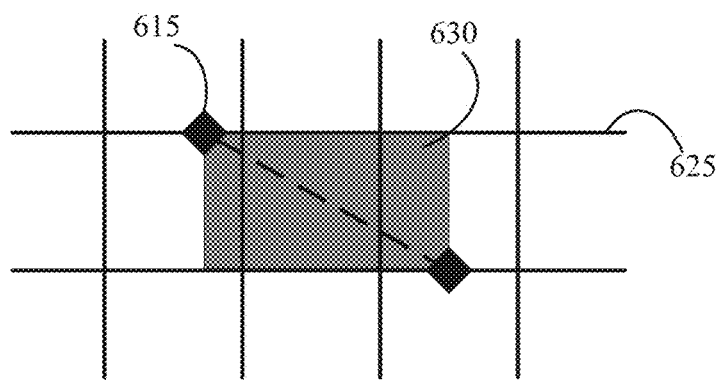

In FIG. 6B, a mesh network area partition 630 encompassing (e.g., enclosing) the pair of loads 615 on the clock mesh area 625 is determined. The mesh network area partition 630 can be a rectangular or square area that encompasses the pair of loads 615. In some embodiments, the loads are vertices on opposite diagonal corners of the mapped area. This ensures that all of the wires in between the pair of loads 615 are identified. In some embodiments, however, if the pair of loads 615 are connected by a single wire (e.g., vertically or horizontally aligned), the mesh network area partition is a single line between the pair of loads 615.

Figure 6C:
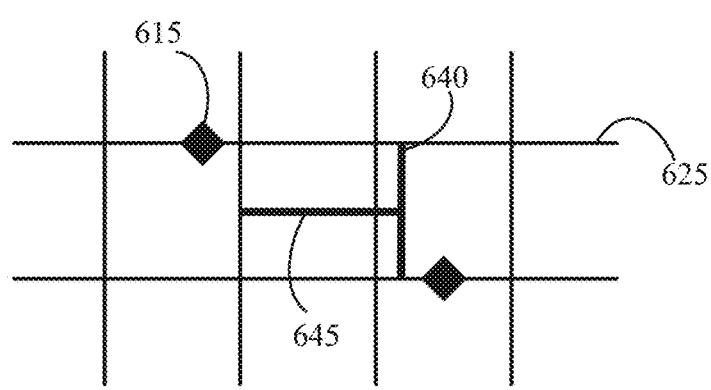

Referring now to FIG. 6C, a first wire 640 and a second wire 645 are added in between wires within the mesh network area partition. Though two wires are added in FIG. 6C, in embodiments, any number of wires can be added to the mesh network area partition. The first wire 640 was added initially (e.g., as in step 520 of FIG. 5), and the clock signal was provided (e.g., as in step 525 of FIG. 5). Afterwards, a determination was made whether the skew between the pair of loads 615 was permissible (e.g., as in step 530 of FIG. 5). In this embodiment, the skew did not attain a permissible level, and accordingly, the second wire 645 was added in between two wires within the mesh network area partition. As illustrated in FIG. 6C, the second wire 645 was added in between the first wire 645 and a wire present in the clock mesh. The clock signal was then provided again (e.g., at step 525 of FIG. 5), and a determination was made whether the skew was permissible (e.g., at step 530 of FIG. 5). The skew attained a permissible level after the addition of the second wire, and accordingly, the clock mesh design was finalized (e.g., process 500 of FIG. 5 terminated).

Figure 6D:
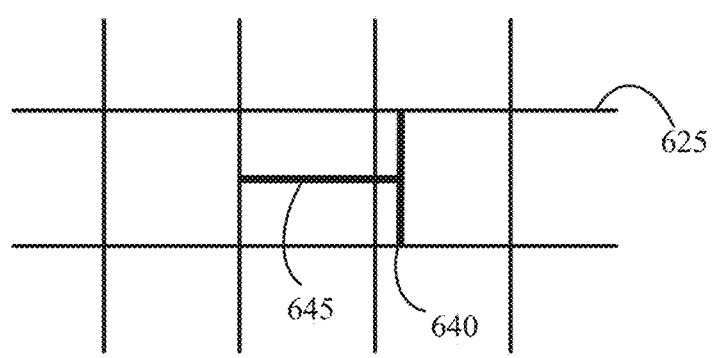

FIG. 6D illustrates the first and second added wires 640 and 645, respectively, omitting the pair of loads 615 and the mesh net area partition 630 from the view, in accordance with embodiments of the present disclosure. The first wire 640 and 645 successfully reduced the skew within the clock mesh 625 to a permissible level. By only locally adding wires to the clock mesh 625, power consumption can be reduced as compared to adding wires throughout the clock mesh 625. Further, reducing the skew can prevent functional errors within the clock mesh, and allow the clock mesh to operate at higher frequencies.

Figure 7:
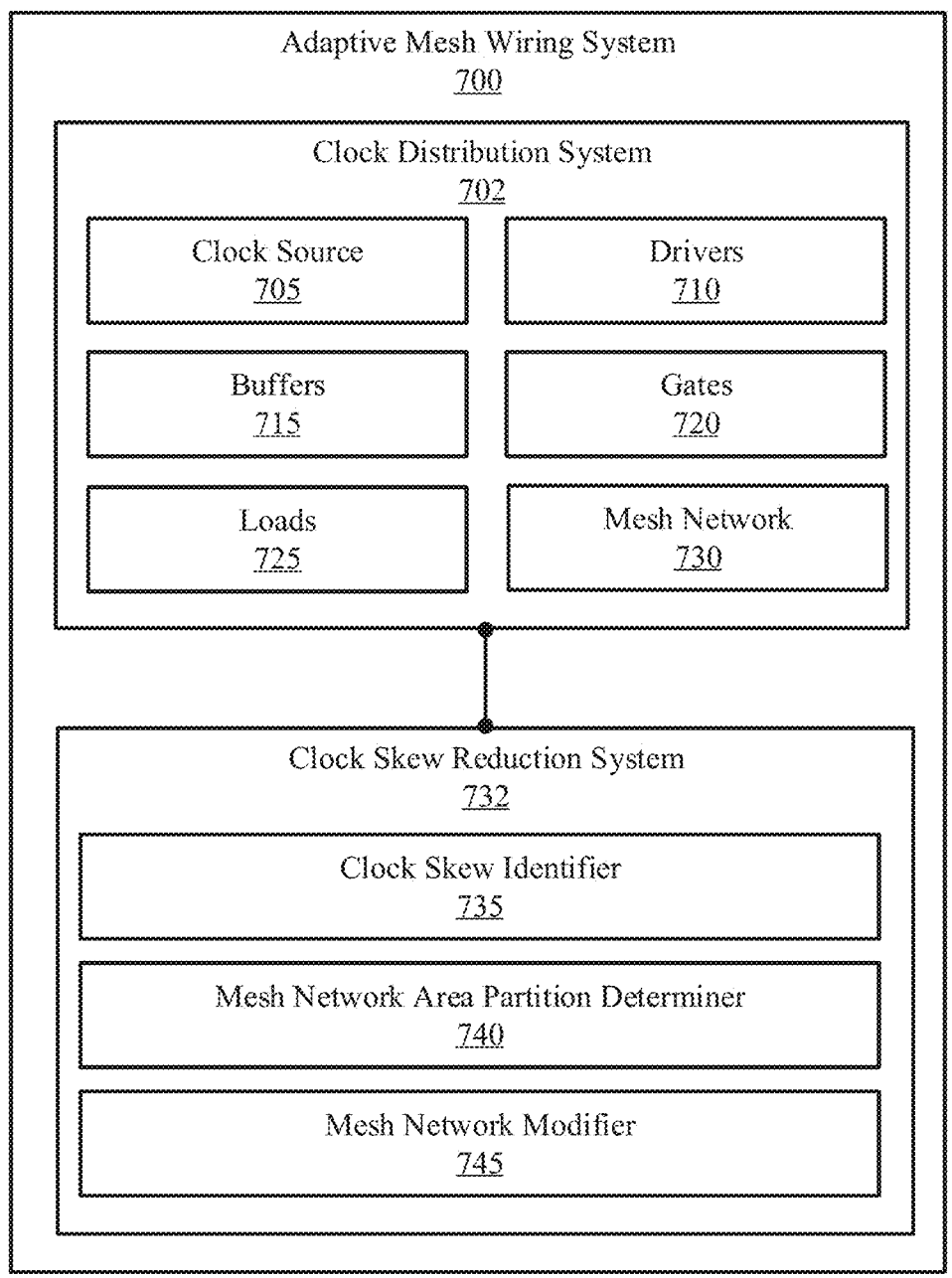
FIG. 7 is a block diagram illustrating an adaptive mesh wiring system, in accordance with embodiments of the present disclosure.

Referring now to FIG. 7, shown is a block diagram illustrating an adaptive mesh wiring system 700, in accordance with embodiments of the present disclosure. The adaptive mesh wiring system 700 includes a clock source distribution system 702 and a clock skew reduction system 732.

The clock distribution system 702 includes various components to distribute a clock signal from a clock source 705 (e.g., CS 105 of FIG. 1) to loads 725 (e.g., loads 115, 315, and 615 of FIGS. 1, 3, and 5, respectively) configured on a mesh network 730 (e.g., clock mesh 120, 325, and 625 of FIGS. 1, 3, and 5, respectively). These components include drivers 710 (e.g., drivers 110 of FIG. 1), buffers 715, and gates 720. The drivers 710 can be configured to drive a clock signal from the clock source 705 to the loads 725. In some embodiments, the drivers 710 are configured to process the clock signal (e.g., transform the signal into a signal compatible with the circuitry). The buffers can be configured to delay the signal prior to reaching the loads 725. The buffers can be fine-tuned such that the clock signal arrives at the loads 725 with reduced skew. The gates 720 can be circuitry configured to selectively transmit the signal to various parts of the clock distribution system 702 to reduce dynamic power dissipation. For example, the gates 720 can be configured to "close" portions of a clock tree, and thus prevent loads 725 (such as flip-flops) from switching states (which consumes power).

The clock skew reduction system 732 is configured to reduce skew within the clock distribution system 702. The clock skew reduction system 732 can be configured to analyze and modify one or more components within the clock distribution system 702. For example, the clock skew reduction system 732 can be configured to modify the frequency of the clock source 705. In some embodiments, the clock skew reduction system 732 is configured to tune the drive strength of the drivers 710. In some embodiments, the clock skew reduction system 732 is configured to tune the buffer-delay of the buffers 715. In some embodiments, the clock skew reduction system 732 is configured to control the gates 720 such that different portions of the clock distribution system 702 are turned on and off.

The clock skew reduction system 732 includes a clock skew identifier 735 which is configured to identify skew between loads 725 configured in the clock distribution system 702. The clock skew identifier 735 can be configured to record errors (e.g., hold violations and set-up violations) occurring at various loads 725. The clock skew identifier 735 can be configured to use the number of recorded errors for each load to determine whether impermissible skew exists between loads 725. For example, the clock skew identifier can be configured to compare a number of observed errors to an error threshold in order to determine whether the skew is permissible.

The clock skew identifier 735 can also be configured to measure skew in between loads 725 such that a determination can be made whether skew is permissible. In some embodiments, the clock skew identifier 735 implements circuitry on the mesh network 730 which is capable of measuring skew between two points. In some embodiments, the clock skew identifier 735 measures skew between simulated loads 725 in a simulated circuit. For example, the clock skew identifier can compare voltage-time curves between loads to identify the skew between the loads.

Upon measuring the skew between two loads, the clock skew identifier 735 can compare the measured skew to one or more skew thresholds to determine whether the skew is permissible. If the measured skew exceeds a skew threshold, then a determination can be made that the skew is impermissible. In some embodiments, multiple thresholds can be implemented to determine the level of skew. For example, two skew thresholds can be implemented. The two skew thresholds can be used to determine whether the skew is permissible (e.g., below both thresholds), flagged (in between the two thresholds), or impermissible (exceeds both thresholds). Based on the determined skew, various mesh modifications can be completed. For example, in an example where mesh wire thickness is increased, the amount the thickness is increased can depend on the level of skew (e.g., a flagged skew level may lead to an increase in wire thickness by 0.1 μm while an impermissible skew level may lead to an increase in wire thickness by 0.5 m). In an example where one or more wires are added, the number and/or placement of wires can depend on the level of skew (e.g., a flagged skew level may lead to adding one wire, where an impermissible skew level may lead to adding two wires).

The clock skew reduction system 732 also includes a mesh network area partition determiner 740 which is configured to determine a mesh network area partition of the mesh network 730. The mesh network area partition can be determined based on the locations of the loads identified with impermissible skew. For example, the mesh network area partition determiner 740 can be configured to automatically map a rectangular or square area of the mesh network 730 using the two loads as vertices (corners) of the mesh network area partition, such that the mesh network area partition encloses the entire area between the two vertices.

The clock skew reduction system 732 further includes a mesh network modifier 745 configured to modify one or more aspects of the mesh network 730. The mesh network modifier 745 can be configured to modify the mesh network 730 by increasing the thickness of wires within the mesh network 730 and/or adding one or more wires to the mesh network 730. In some embodiments, the mesh network modifier 745 modifies a physical mesh network (e.g., mesh network 730). For example, by using photolithography, precision placement, soldering, or other techniques, the mesh network modifier 745 can be configured to physically modify the mesh network 730. In some embodiments, the mesh network modifier 745 is configured to modify a simulated circuit design. In these embodiments, the mesh network modifier 745 includes computer instructions to modify (e.g., increase wire thickness or add wires) the mesh network 730 in a simulated circuit.

In some embodiments, the mesh network modifier 745 is configured to simultaneously increase wire thickness and add one or more wires within the mesh network 730 (e.g., either in a simulation or physically). For example, if there are two skew thresholds of 5 ps and 10 ps, and measured skew as indicated by the clock skew identifier 735 is less than 5 ps (e.g., the skew is permissible), no modifications may be made to the mesh network 730. If the measured skew is in between 5 ps and 10 ps (e.g., the skew is flagged), only either the wire thickness may be increased or an additional wire may added. If the measured skew is above 10 ps (e.g., the skew is impermissible), both the wire thickness can be increased and one or more additional wires can be added.

In some embodiments, the mesh network modifier can be configured to increase the thickness of newly added wires. For example, a first iteration of mesh network 730 modification may include adding an additional wire to the mesh network 730 in response to an impermissible skew. Upon re-transmitting the clock signal, and determining another impermissible skew, the mesh network modifier 745 can be configured to increase the thickness of the newly added wire to attempt to reduce skew. This can be completed to reduce the resistance of the newly added wire, increasing current flow between the pair of loads with impermissible skew.

After modifications are made to the mesh network 730 by the mesh network modifier 745, the skew identifier 735 can be configured to determine whether the skew is permissible. If the skew is determined to be permissible, no further modifications may be made by the mesh network modifier 745. In the case of a simulated circuit, the modified mesh network 730 of the simulated circuit can be transmitted for manufacturing (e.g., the simulated circuit can be used as a blueprint for photolithography manufacturing). If the skew identifier 735 indicates that the skew remains high between the pair of loads 725 on the mesh network 730, then additional modification iterations can be completed by the clock skew reduction system 732.

In some embodiments, functions of the components described in FIG. 7 (e.g., clock skew identifier 735, mesh network area partition determiner 740, and mesh network modifier 745) can be executed by a hardware processor of a computer system.

FIG. 8 is a flow diagram illustrating an example process 800 for adaptively sizing clock mesh wiring to attempt to reduce local power consumption, in accordance with embodiments of the present disclosure. As referenced in FIG. 8, the clock mesh, drivers, loads, and clock source can be the same as or substantially similar to the clock mesh 120, drivers 110, loads 115, and clock source 105 depicted in FIG. 1.

The process 800 starts by providing a clock signal to a clock mesh area (e.g., clock mesh 120 of FIG. 1). This is illustrated at step 805. The clock signal can be provided to the clock mesh area via circuitry coupling a clock source (e.g., CS 105) to the clock mesh area. For example, as illustrated in FIG. 1, clock source circuitry 130 and driver circuitry 125 allow transmission of the clock signal from the clock source 105 to the clock mesh 120. Various intermediate components or transmission lines can be implemented to drive the clock signal to the clock mesh area. For example, drivers (e.g., drivers 110) can be implemented to drive the clock signal from the clock source to the clock mesh area.

A pair of loads with permissible skew is then identified after the clock signal is provided to the clock mesh area. This is illustrated at step 810. The pair of loads with permissible skew can be identified in any manner. In some embodiments, the pair of loads with permissible skew are identified based on observed errors between the loads. For example, a high relative occurrence of hold-violations (e.g., an input signal changes too soon after the clock's active transition) and/or set-up violations (e.g., when a signal arrives too late, and misses the time when it should be dispatched) can indicate whether the pair of loads have impermissible skew, whereas the absence of errors can indicate whether the loads have permissible skew. In these examples, a threshold number of observable errors can be predefined in order to determine whether skew between any two loads is permissible (e.g., by the number of errors falling below the threshold). For example, if a number of violations (e.g., functional errors) falls below two violations, a determination can be made that the pair of loads have permissible skew.

In some embodiments, the pair of loads with permissible skew is identified based on measured skew. For example, circuitry (e.g., skew sensors and/or skitters) exists which is capable of measuring the skew between any two given points on a clock mesh. Accordingly, the skew can be measured between a pair of loads, and based on the measured skew value, a determination can be made whether the skew is permissible. In some embodiments, permissible skew is determined based on the measured skew falling below a skew threshold. For example, if a skew threshold is set to 5 picoseconds (ps), and measured skew between two loads is 2 ps, then the skew between the pair of loads can be determined to be permissible.

In some embodiments, the pair of loads with permissible skew is identified based on a simulation. For example, for a simulated circuit, an analog simulation can be executed in order to determine the skew between the loads configured on the simulated circuit. In this example, the analog simulation can output a time-voltage waveform for each load, and the skew can be determined by comparing the time-voltage waveforms for each load (e.g., see FIG. 4 for more details). The skew can be indicated based on the time difference between the two wave forms (e.g., one for each load) at half of the supply voltage.

Upon identifying the pair of loads with permissible skew, a mesh network area partition which encompasses the pair of loads with permissible skew is determined. This is illustrated at step 815. The mesh network area partition can be an area of the clock mesh that encloses the pair of loads with permissible skew. In some embodiments, the mesh network area partition can be the entire clock mesh network area (e.g., if the loads are on opposite corners of the clock mesh network). The clock mesh network area partition can be mapped (e.g., constructed, determined, visually represented, etc.) such that the two loads are opposite vertices (corners) of a rectangular area that includes all of the wires between the two loads (e.g., see FIG. 9B for more detail, the mesh network area partition is the gray box). In some embodiments however, if the pair of loads with permissible skew are connected by a single wire (e.g., horizontally or vertically aligned on the mesh), the mesh network area partition can be a line between the pair of loads.

A wire width (thickness or diameter) of a portion of the wires within the mesh network area partition is decreased. This is illustrated at step 820. The portion of wires that is decreased can be the segment of wires electrically bridging the two loads on the clock mesh network. For example, segments of wires which do not directly electrically couple a signal from a particular load to another particular load may remain unmodified.

Conversely, in some embodiments, the thickness of all of the wires within the mesh network area partition is decreased. As an example, if the pair of loads with permissible skew are connected by a single wire (e.g., the loads are vertically or horizontally aligned on the mesh), the thickness of the entire wire in between the pair of loads can be decreased. This is because the mesh network area partition and the portion of wires that bridge the pair of loads are the same.

Wire width can be locally decreased to reduce power consumption because, by decreasing the wire thickness, resistance is increased. This allows a lower amount of current to flow between the loads and reduces the power consumed by the loads.

The width of the portion of the wire can be decreased in any manner. In some embodiments, the wire width is decreased by a certain factor (e.g., by a factor of 2, 5, etc.) or by a certain amount (e.g., decrease the wire diameter by 0.2 µm, 0.5 µm, etc.). In some embodiments, the wire width is decreased to a fixed value. For example, the wire width can be decreased to a specified diameter (e.g., 1 µm diameter). In some embodiments, the wire width is decreased based on available wire sizes (e.g., if only 1 µm, 1.4 µm, and 1.8 µm diameter wires are available, the width can be selected based on the available wires). In some embodiments, the wire width is decreased based on the measured skew. For example, wires coupling pairs of loads with relatively lower skew can have their thickness decreased by a greater amount (e.g., wires between loads with a 4 ps skew measurement may only have their diameter decreased by 0.3 µm, whereas wires between loads with a 0.5 ps skew measurement may have their diameter decreased by 1 µm).

In some embodiments, wire thickness is decreased in a simulated circuit. In these embodiments, simulated wires can be modified as specified by simulation software. For example, wire thickness can be decreased in a simulation by setting the wire diameter to a specific value. The simulated circuit with the modified wires can then be transmitted to be used for manufacturing (e.g., the simulated circuit is used a blue-print for photolithography manufacturing).

In some embodiments, wire thickness is incrementally decreased until a proper wire thickness is selected. For example, the wire thickness can be decreased by a certain amount (e.g., 0.05 µm) every iteration until a determination is made that the skew is impermissible (further discussed with regard to decision block 830).

In some embodiments, wire thickness is decreased on a physical circuit. In some embodiments, wire thickness is decreased using photolithography techniques. In some embodiments, wire thickness is decreased by replacing wires with thinner wires (e.g., using a precision placement assembly). The thickness of physical wires can be decreased in any manner otherwise consistent herein.

After the wire width of the portion of wires within the mesh network area partition is decreased, a clock signal is provided to the clock mesh area again. This is illustrated at step 825. The clock signal provided at step 825 can be the same as the clock signal provided at step 805 (e.g., with the same frequency from the same clock source). In some embodiments, however, the clock signal provided at step 825 can differ from the clock signal provided at step 805 (e.g., the new signal can originate from a different clock source, or alternatively have different characteristics (such as frequency)). This is completed to determine whether the skew is impermissible between the identified loads with permissible skew.

After the wire thickness for the portion of wires is decreased and the clock signal is provided again, a determination is made whether the skew for the pair of loads is permissible. This is illustrated at step 830. Step 830 can be completed in a similar manner to step 810 for identifying the pair of loads with permissible skew. For example, observed functional errors or measured skew can be used to determine whether the skew is permissible. If observed functional errors are used to determine whether skew is permissible, the observed functional errors can be compared to a functional error threshold. If the functional error threshold is satisfied (e.g., the number of observed functional errors is equal to or less than the specified threshold), a determination can be made that the skew is permissible. Similarly, if measured skew is used to determine whether the skew is permissible, the measured skew can be compared to a skew threshold. If the skew threshold is satisfied (e.g., the measured skew is equal to or less than the skew threshold), a determination can be made that the skew is permissible.

If a determination is made that the skew is permissible at step 830, then process 800 terminates, as decreasing the wire thickness in the local area was effective (as the power consumption as reduced while maintaining a permissible skew). If a determination is made that the skew is impermissible, then step 830 proceeds to step 835, where the modifications to the thickness of the wires are reverted. This is completed as decreasing the wire thickness caused an impermissible skew. Accordingly, the wire(s) which had their thickness decreased are reverted back to the thickness prior to modification. In some embodiments, upon reverting the wire thickness modifications at step 835, another pair of loads with permissible skew are identified at step 810. In some embodiments, the thickness is not completely reverted, and the wire thickness of the portion of wires within the mesh network area partition is only partially increased.

FIGS. 9A, 9B, 9C, and 9D illustrate diagrammatic depictions for the process 800 to attempt to reduce local power consumption in a clock mesh by decreasing wire thickness, in accordance with embodiments of the present disclosure.

Figure 9A:
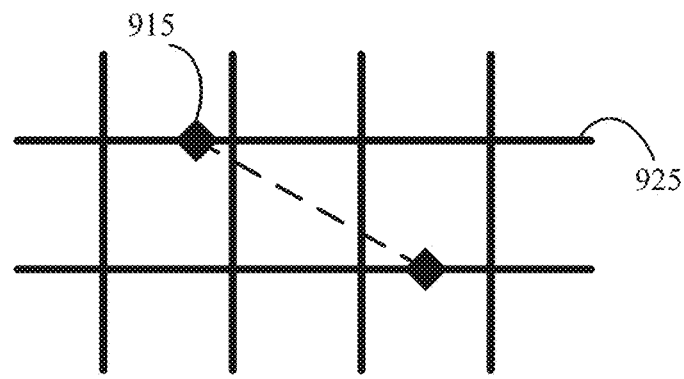
FIGS. 9A, 9B, 9C, and 9D illustrate diagrammatic depictions for a process to attempt to reduce local power consumption in a clock mesh by decreasing wire thickness, in accordance with embodiments of the present disclosure.

As depicted in FIG. 9A, a pair of loads 915 (as indicated by the diamonds connected by a dashed line) with permissible skew on a clock mesh area 925 is identified. The pair of loads 915 with permissible skew can be identified in a similar manner to step 810 of FIG. 8. For example, observed functional errors and measured skew can be used to determine whether the skew is permissible by comparing the observed metrics to one or more thresholds.

Figure 9B:
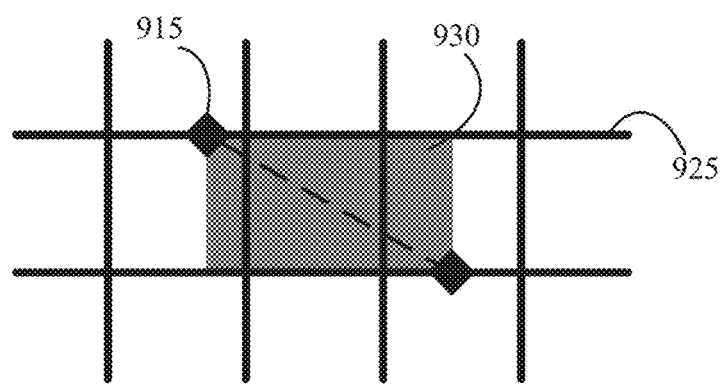

In FIG. 9B, a mesh network area partition 930 encompassing (e.g., enclosing) the pair of loads 915 on the clock mesh area 925 is determined. The mesh network area partition 930 can be a rectangular or square area that encompasses the pair of loads 915. In some embodiments, the loads are vertices on opposite diagonal corners of the mapped area. This ensure that all of the wires in between the pair of loads 915 are identified. In some embodiments, however, if the pair of loads 915 are connected by a single wire (e.g., vertically or horizontally aligned), the mesh network area partition is a single line between the pair of loads 915.

Figure 9C:
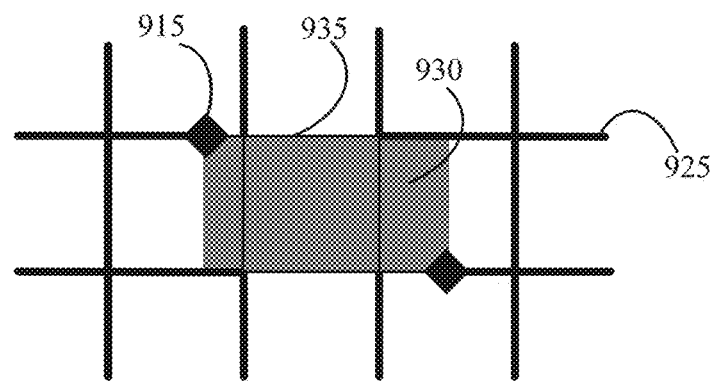

Referring now to FIG. 9C, a wire diameter of a portion of wires 935 within the mesh network area partition 930 is decreased. The wire diameter of the portion of wires 935 can be decreased in a similar manner as step 820 of FIG. 8. For example, the wire diameter can be decreased by a particular magnitude, value, etc. In some embodiments, the wire diameter can be decreased based on observed skew (e.g., lower skew may lead to a greater wire thickness decrease). The wire diameter can be decreased such that resistance within the portion of wires 935 is increased, decreasing the current in the portion of wires 935 and potentially reducing power consumption between the pair of loads 915.

Figure 9D:
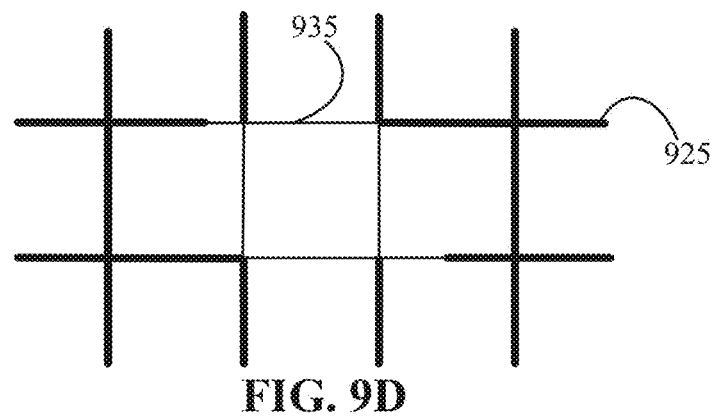

Referring now to FIG. 9D, illustrated is a diagram of the clock mesh 925 with the portion of wires 935 with decreased thickness, omitting the pair of loads 915 and the mesh net area partition 930 from the view, in accordance with embodiments of the present disclosure. The diameter is not decreased for the portion of wires which do not electrically couple the pair of loads 915 within the mesh network area partition 930 (e.g., the portion of wires within the mesh net area partition 930 that are not represented with thicker lines).

Figure 10:
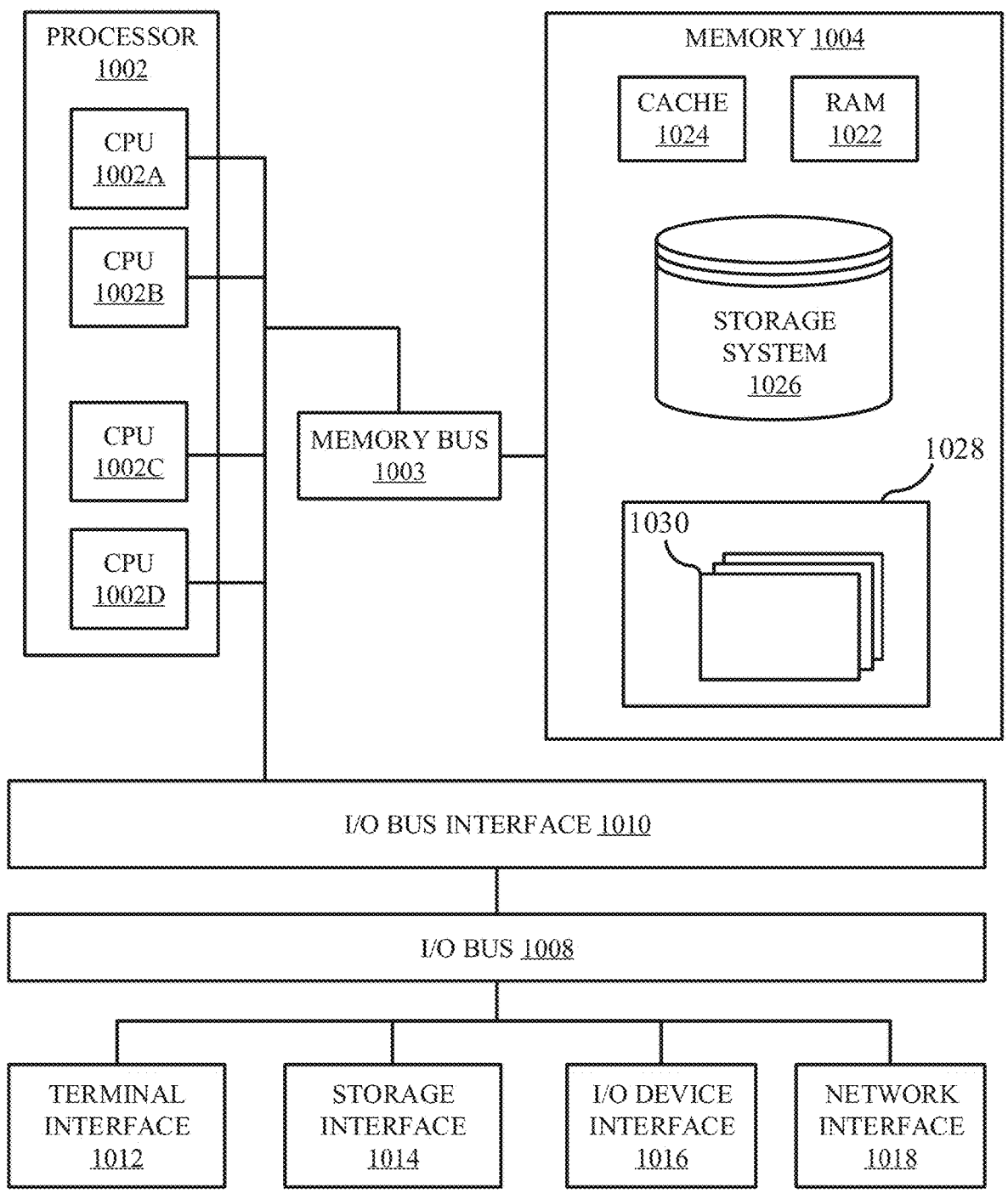
FIG. 10 is a high-level block diagram illustrating an example computer system that can be used in implementing one or more of the methods, tools, and modules, and any related functions, described herein, in accordance with embodiments of the present disclosure.

Referring now to FIG. 10, shown is a high-level block diagram of an example computer system 1001 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 1001 may comprise one or more CPUs 1002, a memory subsystem 1004, a terminal interface 1012, a storage interface 1014, an I/O (Input/Output) device interface 1016, and a network interface 1018, all of which may be communicatively coupled, directly or indirectly, for inter-component communication via a memory bus 1003, an I/O bus 1008, and an I/O bus interface unit 1010.

The computer system 1001 may contain one or more general-purpose programmable central processing units (CPUs) 1002A, 1002B, 1002C, and 1002D, herein generically referred to as the CPU 1002. In some embodiments, the computer system 1001 may contain multiple processors typical of a relatively large system; however, in other embodiments the computer system 1001 may alternatively be a single CPU system. Each CPU 1002 may execute instructions stored in the memory subsystem 1004 and may include one or more levels of on-board cache.

System memory 1004 may include computer system readable media in the form of volatile memory, such as random access memory (RAM) 1022 or cache memory 1024. Computer system 1001 may further include other removable/non-removable, volatile/non-volatile computer system storage media. By way of example only, storage system 1026 can be provided for reading from and writing to a non-removable, non-volatile magnetic media, such as a "hard-drive." Although not shown, a magnetic disk drive for reading from and writing to a removable, non-volatile magnetic disk (e.g., a "USB thumb drive" or "floppy disk"), or an optical disk drive for reading from or writing to a removable, non-volatile optical disc such as a CD-ROM, DVD-ROM or other optical media can be provided. In addition, memory 1004 can include flash memory, e.g., a flash memory stick drive or a flash drive. Memory devices can be connected to memory bus 1003 by one or more data media interfaces. The memory 1004 may include at least one program product having a set (e.g., at least one) of program modules that are configured to carry out the functions of various embodiments.

One or more programs/utilities 1028, each having at least one set of program modules 1030 may be stored in memory 1004. The programs/utilities 1028 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 1028 and/or program modules 1030 generally perform the functions or methodologies of various embodiments.

In some embodiments, the program modules 1030 of the computer system 1001 include a skew reduction module. The skew reduction module can be configured to identify a pair of loads with high skew in a clock mesh distribution system. Further, the skew reduction module can be configured identify a mesh network area partition enclosing the identified loads on the clock mesh. The skew reduction module can then be configured to modify the mesh network (e.g., increase a thickness of a portion of wires in the mesh network area and/or add one or more addition wires between wires in the mesh network area partition) to attempt to reduce skew within the clock distribution mesh.

Although the memory bus 1003 is shown in FIG. 10 as a single bus structure providing a direct communication path among the CPUs 1002, the memory subsystem 1004, and the I/O bus interface 1010, the memory bus 1003 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 1010 and the I/O bus 1008 are shown as single respective units, the computer system 1001 may, in some embodiments, contain multiple I/O bus interface units 1010, multiple I/O buses 1008, or both. Further, while multiple I/O interface units are shown, which separate the I/O bus 1008 from various communications paths running to the various I/O devices, in other embodiments some or all of the I/O devices may be connected directly to one or more system I/O buses.

In some embodiments, the computer system 1001 may be a multi-user mainframe computer system, a single-user system, or a server computer or similar device that has little or no direct user interface, but receives requests from other computer systems (clients). Further, in some embodiments, the computer system 1001 may be implemented as a desktop computer, portable computer, laptop or notebook computer, tablet computer, pocket computer, telephone, smart phone, network switches or routers, or any other appropriate type of electronic device.

It is noted that FIG. 10 is intended to depict the representative major components of an exemplary computer system 1001. In some embodiments, however, individual components may have greater or lesser complexity than as represented in FIG. 10, components other than or in addition to those shown in FIG. 10 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A method comprising:
    providing a clock signal to a clock mesh area, wherein the clock mesh area includes a plurality of wires configured in a grid;
    identifying a pair of loads with impermissible skew within the clock mesh area, wherein impermissible skew is indicated based on a threshold value;
    determining a mesh network area partition enclosing the pair of loads with impermissible skew; and
    increasing a wire width of a portion of wires included in the mesh network area partition.

2. The method of claim 1, wherein the threshold value is a skew threshold, wherein the pair of loads with impermissible skew are identified based on a measured skew between the pair of loads exceeding the skew threshold.

3. The method of claim 1, wherein the threshold value is a functional error threshold, wherein the pair of loads with impermissible skew are identified based on measured functional errors associated with the pair of loads exceeding the functional error threshold.

4. The method of claim 1, wherein the clock signal, clock mesh area, pair of loads, and the plurality of wires are simulated.

5. The method of claim 4, wherein the pair of loads with impermissible skew are identified based on a comparison between time-voltage curves for each of the pair of loads, wherein a measured skew between the pair of loads is indicated based on a time difference at half of a supply voltage between the time-voltage curves for each load of the pair of loads, wherein the threshold value is a skew threshold, wherein the pair of loads with impermissible skew are identified in response to the measured skew exceeding the skew threshold.

6. The method of claim 1, further comprising:
    providing a second clock signal to the identified pair of loads with impermissible skew after the wire width of the portion of wires included in the mesh network area is increased;
    determining whether a skew between the pair of loads is impermissible in response to providing the second clock signal; and
    increasing, in response to determining that the skew for the pair of loads is impermissible; the wire width of the portion of the plurality of wires included in the mesh network area partition a second time.

7. A method comprising:
    providing a clock signal to a clock mesh area, wherein the clock mesh area includes a plurality of wires configured in a grid;
    identifying a pair of loads with impermissible skew within the clock mesh area, wherein impermissible skew is indicated based on a threshold value;
    determining a mesh network area partition enclosing the pair of loads with impermissible skew; and
    adding a first wire between two wires included in the mesh network area partition.

8. The method of claim 7, wherein the threshold value is a skew threshold, wherein the pair of loads with impermissible skew are identified based on a measured skew between the pair of loads exceeding the skew threshold.

9. The method of claim 7, wherein the threshold value is a functional error threshold, wherein the pair of loads with impermissible skew are identified based on measured functional errors associated with the pair of loads exceeding the functional error threshold.

10. The method of claim 7, wherein the clock signal, clock mesh area, pair of loads, the plurality of wires, and the first wire are simulated.

11. The method of claim 10, wherein the pair of loads with impermissible skew are identified based on a comparison between time-voltage curves for each of the pair of loads, wherein a measured skew between the pair of loads is indicated based on a time difference at half of a supply voltage between the time-voltage curves for each load of the pair of loads, wherein the threshold value is a skew threshold, wherein the pair of loads with impermissible skew are identified in response to the measured skew exceeding the skew threshold.

12. The method of claim 7, further comprising:
    providing a second clock signal to the identified pair of loads with impermissible skew after the first wire is added between two wires in the mesh network area partition;
    determining whether a skew between the pair of loads is impermissible; and
    adding, in response to determining that the skew between the pair of loads is impermissible, a second wire in between two wires in the mesh network area partition.

13. The method of claim 12, wherein the second wire is added in between the first added wire and a third wire present in the mesh network area partition.

14. A system comprising:
    a clock source configured to generate a clock signal;
    a mesh network including a plurality of loads configured to receive the clock signal, wherein the mesh network includes a plurality of wires configured in a grid; and
    a clock skew reduction system, wherein the clock skew reduction system includes:
        a clock skew identifier configured to identify a pair of loads of the plurality of loads with impermissible skew, wherein impermissible skew is indicated based on a threshold value;
        a mesh network area partition determiner configured to determine a mesh network area partition enclosing the pair of loads; and
        a mesh network modifier configured to increase a wire width of a portion of wires included in the mesh network area partition.

15. The system of claim 14, wherein the threshold value is a skew threshold, wherein the pair of loads with impermissible skew are identified based on a measured skew between the pair of loads exceeding the skew threshold.

16. The system of claim 14, wherein the threshold value is a functional error threshold, wherein the pair of loads with impermissible skew are identified based on measured functional errors associated with the pair of loads exceeding the functional error threshold.

17. The system of claim 14, wherein the clock source, the clock signal, the mesh network, the plurality of loads, and the plurality of wires are simulated.

18. The system of claim 17, wherein the pair of loads with impermissible skew are identified based on a comparison between time-voltage curves for each of the pair of loads, wherein a measured skew between the pair of loads is indicated based on a time difference at half of a supply voltage between the time-voltage curves for each load of the pair of loads, wherein the threshold value is a skew threshold, wherein the pair of loads with impermissible skew are identified in response to the measured skew exceeding the skew threshold.

19. The system of claim 14,
wherein the clock source is configured to provide a second clock signal to the identified pair of loads with impermissible skew after the wire width of the portion of wires included in the mesh network area is increased;
wherein the clock skew identifier is configured to determine whether a skew between the pair of loads is impermissible in response to providing the second clock signal; and
wherein the mesh network modifier is configured to increase, in response to the skew between the pair of loads being impermissible in response to providing the second clock signal, the wire width of the portion of wires included in the mesh network a second time.

20. A system comprising:
a clock source configured to generate a clock signal;
a mesh network including a plurality of loads configured to receive the clock signal, wherein the mesh network includes a plurality of wires configured in a grid; and
a clock skew reduction system, wherein the clock skew reduction system includes:
a clock skew identifier configured to identify a pair of loads of the plurality of loads with impermissible skew;
a mesh network area partition determiner configured to determine a mesh network area partition enclosing the pair of loads; and
a mesh network modifier configured to add a wire between two wires of the plurality of wires within the mesh network area partition.

21. The system of claim 20, wherein the threshold value is a functional error threshold, wherein the pair of loads with impermissible skew are identified based on measured functional errors associated with the pair of loads exceeding the functional error threshold.

22. The system of claim 20,
wherein the clock source, the clock signal, the mesh network, the plurality of loads, and the plurality of wires are simulated,
wherein the skew identifier measures a skew between the pair of loads based on a time difference at half of a supply voltage between time-voltage curves for each load of the pair of loads,
wherein the threshold value is a skew threshold, and
wherein the pair of loads with impermissible skew are identified in response to the measured skew exceeding the skew threshold.

23. A method comprising:
providing a clock signal to a clock mesh area, wherein the clock mesh area includes a plurality of wires configured in a grid;
identifying a pair of loads with permissible skew within the clock mesh area, wherein permissible skew is indicated based on a threshold value;
determining a mesh network area partition enclosing the pair of loads with permissible skew; and
decreasing a wire width of a portion of wires included in the mesh network area partition.

24. The method of claim 23, wherein the threshold value is a skew threshold, wherein the pair of loads with permissible skew are identified based on a measured skew between the pair of loads falling below the skew threshold.

25. The method of claim 23, wherein the threshold value is a functional error threshold, wherein the pair of loads with permissible skew are identified based on measured functional errors associated with the pair of loads falling below the functional error threshold.

* * * * *